United States Patent [19]
Armstrong et al.

[11] Patent Number: 5,701,314
[45] Date of Patent: Dec. 23, 1997

[54] ON-THE-FLY ERROR CORRECTION USING THERMAL ASPERITY ERASURE POINTERS FROM A SAMPLED AMPLITUDE READ CHANNEL IN A MAGNETIC DISK DRIVE

[75] Inventors: Alan J. Armstrong, Broomfield; Christopher P. Zook, Longmont, both of Colo.

[73] Assignee: Cirrus Logic, Inc., Fremont, Calif.

[21] Appl. No.: 576,742

[22] Filed: Dec. 21, 1995

[51] Int. Cl.$^6$ ................................. G11B 20/18
[52] U.S. Cl. ................................. 371/40.3
[58] Field of Search ......................... 371/40.3

[56] References Cited

U.S. PATENT DOCUMENTS

| | | | |
|---|---|---|---|
| 5,233,482 | 8/1993 | Galbraith et al. | 360/46 |
| 5,367,409 | 11/1994 | Ottesen et al. | 360/32 |
| 5,446,743 | 8/1995 | Zook | 371/37.1 |

OTHER PUBLICATIONS

Galbraith et al., "Magneto–Resistive Head Thermal Asperity Digital Compensation", IEEE Transactions on Magnetics, vol. 28, No. 5, Sep. 1992, pp. 2731–2732, Sep. 1992.

Primary Examiner—Stephen M. Baker
Attorney, Agent, or Firm—Howard H. Sheerin

[57] ABSTRACT

In a magnetic disk drive storage system comprising a sampled amplitude read channel and an on-the-fly error correction coding (ECC) system, a thermal asperity compensation technique wherein: a thermal asperity (TA) detection circuit detects a saturation condition in the sample values of the analog read signal which indicates the presence of a TA; a pole of an AC coupling capacitor is elevated; timing recovery, gain control, and DC offset loops in the read channel are held constant; TA erasure pointers are generated corresponding to the duration of the TA transient; and an on-the-fly error detection and correction (EDAC) circuit processes the TA erasure pointers to correct errors in the detected digital data caused by the TA. Using TA erasure pointers to compensate for the effect of thermal asperities minimizes the cost, complexity, and redundancy of the ECC. Further, soft errors in the prior art method of adjusting the headroom of the read channel ADC are avoided. Still further, the EDAC circuitry can process the erasure pointers on-the-fly and still correct a sufficient number of soft errors without having to perform any significant number of reread operations. In this manner, the disk drive storage system operates virtually uninterrupted in reading data from the disk and transferring it to a host computer.

14 Claims, 18 Drawing Sheets

ON-THE-FLY ERROR CORRECTION USING THERMAL ASPERITY ERASURE POINTERS FROM A SAMPLED AMPLITUDE READ CHANNEL IN A MAGNETIC DISK DRIVE

CROSS-REFERENCE TO RELATED PATENTS AND APPLICATIONS

This patent application is related to other U.S. patents and patent applications. Namely, U.S. patent application Ser. No. 08/341,723 entitled "Decimation DC Offset Control in a Sampled Amplitude Read Channel," and Ser. No. 08/313,491 entitled "Improved Timing Recovery for Synchronous Partial Response Recording". And U.S. Pat. No. 5,446,743 entitled "Coefficient Update Method and Apparatus for Reed-Solomon Decoder," and U.S. Pat. No. 5,467,297 entitled "Finite Field Inversion". The above referenced patents and patent applications are hereby incorporated by reference.

1. Field of Invention

The present invention relates to the control of magnetic disk storage systems for digital computers, particularly to a method and apparatus for detecting and correcting errors in a read signal when a magneto-resistive read head physically strikes an asperity on the surface of the disk causing a temperature transient in its strip element, a phenomenon referred to as Thermal Asperity (TA).

2. Background of the Invention

Magnetic disk drives are commonly used in computer systems to reliably store user information in the form of digital data. Inside the disk drive, the digital data serves to modulate current in a read/write head coil in order to write a sequence of corresponding magnetic flux transitions onto the surface of a magnetic medium in concentric, radially spaced tracks at a predetermined baud rate. When reading this recorded data, the read/write head again passes over the magnetic medium and transduces the magnetic transitions into pulses in an analog read signal that alternate in polarity. These pulses are then decoded by read channel circuitry to produce an estimated digital sequence that may contain errors caused by channel noise that obfuscates the read signal. To compensate for these errors, an error detection and correction (EDAC) system implements an error correction code (ECC), such as a Reed-Solomon code, in order to detect and correct the errors to reproduce the originally recorded user data before passing it on to a host computer.

Generally speaking, there are two types of read channels for detecting the digital data from the analog read signal. In a first method, known as analog peak detection, an analog peak detector that operates in continuous time detects the peaks in the analog read signal. The presence of a peak represents a digital "1" bit and the absence of a peak a digital "0" bit. A timing recovery circuit, also responsive to the analog read signal, aligns the peaks to predetermined bit cell periods to determine the number of "0" bits between "1" bits, thereby determining the detected binary sequence (e.g., "10001101001 ... ").

In a second method for detecting the digital sequence, known as sampled amplitude recording or partial response maximum likelihood (PRML) recording, the analog read signal is sampled at the baud rate (write rate) and the digital data detected from these discrete time sample values. Timing recovery in a sampled amplitude system attempts to synchronize the samples to the baud rate rather than align peaks to bit cell periods as in analog peak detection. Also in sampled amplitude detection, a maximum likelihood (ML) sequence detector, such as a Viterbi detector, compensates for intersymbol interference (ISI) and other channel noise during the detection process. This increases the effective signal-to-noise ratio (SNR) and allows for significantly higher data densities (i.e., it increases the disk drive's storage capacity).

There are also various types of read heads used to detect the magnetic flux transitions on the surface of the disk. A thin film read head, for example, uses the write coil to detect inductively the change in the magnetic flux, which generates the corresponding pulses in the analog read signal that alternate in polarity. A more recent read head, known as magneto-resistive (MR), comprises an MR strip element that measures the change in the magnetic flux directly. The resistance of the MR strip is inversely proportional to the strength of the magnetic flux; that is, the resistance of the MR strip will increase as it approaches a magnetic flux transition. When a constant current is passed through the MR strip, the voltage measured across it represents the analog read signal and the corresponding polarity alternating pulses.

One source of channel noise that has been identified by designers of magnetic disk drives is a phenomena known as Thermal Asperity (TA), a transient in the read signal that appears when a MR read head physically strikes an asperity on the surface of the disk. This can significantly increases the temperature of the MR strip element and, because the resistivity of the MR strip increases with temperature, a TA can cause a significant transient in the analog read signal that decays exponentially.

FIG. 5A illustrates the affect of a TA on the read signal: an instantaneous, substantial increase 80 in its DC offset to a point of saturation 82, and then an exponential decay 84 as the TA's effect dissipates. Consequently, the detected estimated digital data will contain errors from the point the MR strip strikes the asperity 80, continuing until the read signal's DC offset falls within a tolerable operating range 86 for the read channel. Unless steps are taken to directly compensate for the errors caused by a thermal asperity, these errors must be detected and corrected by the ECC circuitry. However, it is undesirable to use ECC for detecting and correcting hard errors caused by thermal asperities in addition to correcting soft errors caused by other sources of channel noise for two reasons: first, it increases the cost and complexity of the ECC circuitry; and second, it increases the amount of ECC redundancy added to the user data, thereby decreasing the storage capacity of the disk drive.

Prior art methods are known that directly compensate for TA errors. For example, Richard L. Glaberaith et al. disclose such a method in U.S. Pat. No. 5,233,482 entitled, "Thermal Asperity Compensation For PRML Data Detection." The method disclosed therein comprises the steps of: sampling the analog read signal using and analog-to-digital converter (ADC); detecting when the ADC samples saturate which indicates the occurrence of a TA; elevating a pole of an AC coupling capacitor; holding the timing recovery and gain control loops at a state just before the TA occurred; and adjusting the headroom of the ADC and the target settings of a sequence detector. When the effect of the TA dissipates, the ADC and sequence detector are re-adjusted to their normal operating setting.

FIG. 5B illustrates the affect of the TA compensation method described in the above '482 patent. Elevating the pole of the AC coupling capacitor reduces the TA time constant causing the DC offset to decay to a tolerable operating range 86 faster, thereby decreasing the total number of data symbols corrupted by the TA. While the ADC samples are saturated 82, the data symbols corrupted by TA errors are detected and corrected by the ECC circuitry. When the ADC samples come out of saturation and begin to decay 84 toward the tolerable operating range 86, the head room of the ADC is increased by decreasing the signal gain by half. In other words, during the time the ADC samples are decaying 84, they are scaled to fit within the tolerable operating range of the read channel. In this manner, the read channel can accurately detect most of the digital data rather than having to rely on more complex and costly ECC circuitry that uses more redundancy.

There are problems associated with the above method for TA compensation. Namely, increasing the ADC headroom by decreasing the signal gain results in an increased number of soft errors due to the DC offset and decrease in ADC resolution (i.e., quantization noise). Often times the number of soft errors will exceed the error correction capability of the ECC circuitry. In this event, the read channel must wait for the disk to make a revolution and try to read the data again. This process repeats until the number of soft errors is within the error detection and correction capability of the ECC circuitry. However, multiple rereads increases the overall access time, an extremely undesirable effect. Furthermore, at the end of the TA compensation, when the signal gain is increased and the headroom of the ADC re-adjusted back to its normal operating range, a transient occurs which can introduce still more soft errors.

There is, therefore, a need for a TA compensation method and apparatus that does not suffer from the soft errors caused by adjusting the headroom of an ADC in a sampled amplitude read channel. Also needed is a TA compensation method that does not significantly increase the cost, complexity, or redundancy of the ECC system used to correct errors in the detected data stream. Still further, a TA compensation method is needed that reduces the number of necessary rereads so that the storage system can read data from the disk and transfer it to the host computer virtually on-the-fly.

SUMMARY OF THE INVENTION

In a magnetic disk drive storage system comprising a sampled amplitude read channel and an on-the-fly error correction coding (ECC) system, a thermal asperity compensation technique wherein: a thermal asperity (TA) detection circuit detects a saturation condition in the sample values of the analog read signal which indicates the presence of a TA; a pole of an AC coupling capacitor is elevated; timing recovery, gain control, and DC offset loops in the read channel are held constant; TA erasure pointers are generated corresponding to the duration of the TA transient; and an on-the-fly error detection and correction (EDAC) circuit processes the TA erasure pointers to correct errors in the detected digital data caused by the TA. Using TA erasure pointers to compensate for the effect of thermal asperities minimizes the cost, complexity, and redundancy of the ECC. Further, soft errors in the prior art method of adjusting the headroom of the read channel ADC are avoided. Still further, the EDAC circuitry can process the erasure pointers on-the-fly and still correct a sufficient number of soft errors without having to perform any significant number of reread operations. In this manner, the disk drive storage system operates virtually uninterrupted in reading data from the disk and transferring it to a host computer.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

System Overview

Figure 1:
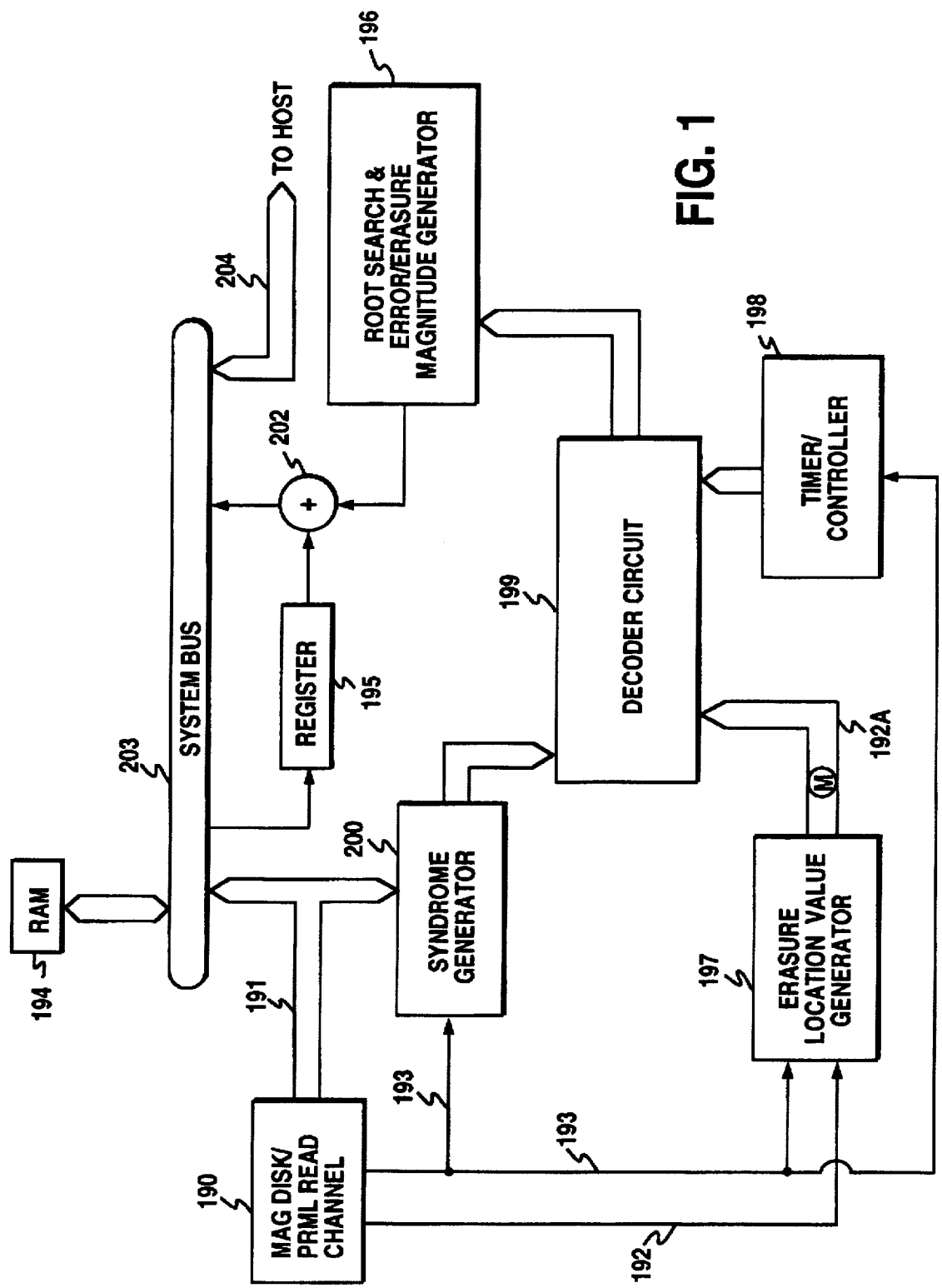
FIG. 1 is a schematic view generally showing a block diagram of a sampled amplitude read channel and an error correction system according to an embodiment of the invention.
Figure 2:
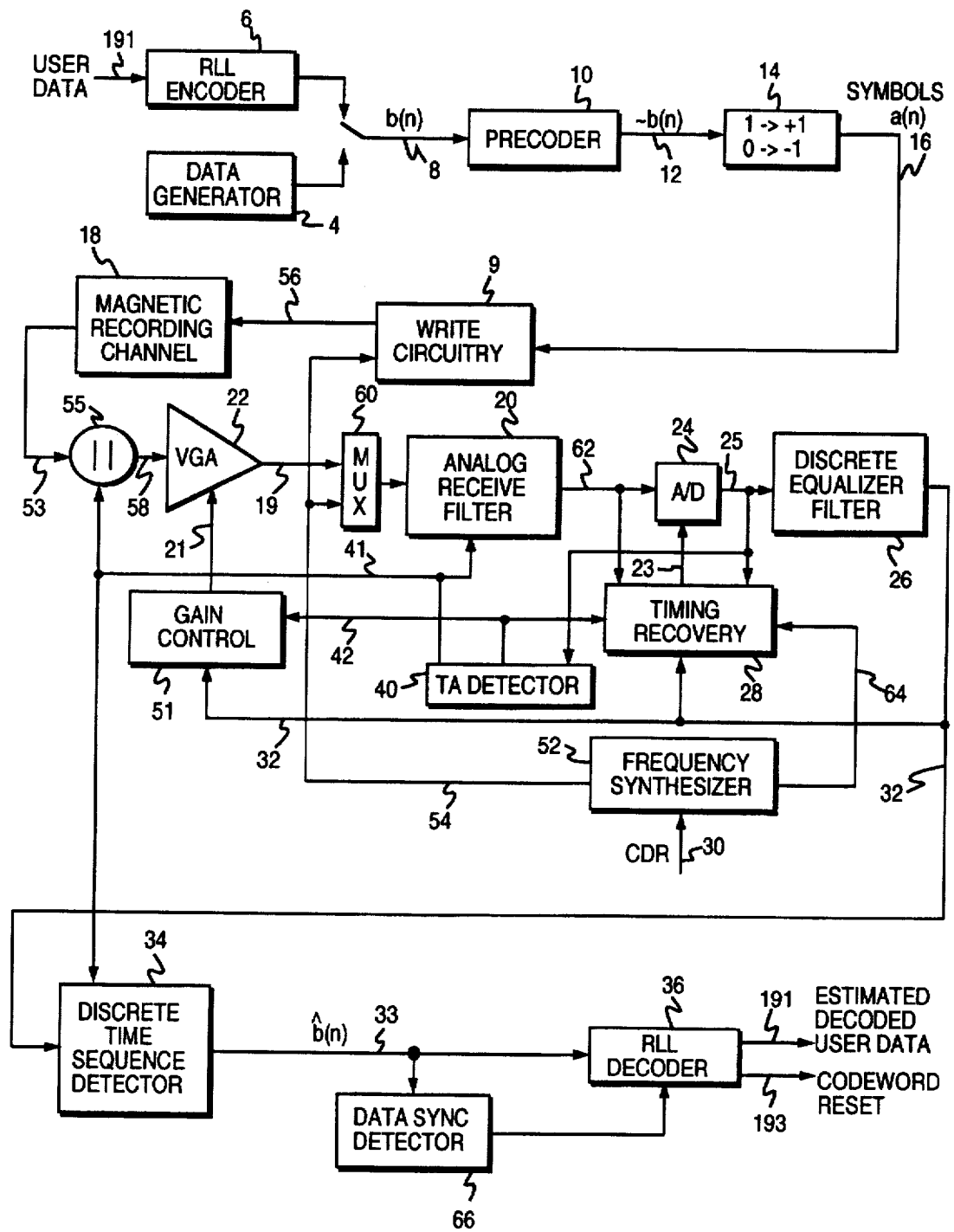
FIG. 2 shows a block diagram of a prior art sampled amplitude read channel comprising a TA compensation circuit.

FIG. 1 schematically illustrates the magnetic disk storage system according to an embodiment of the present invention. A magnetic disk PRML read channel 190 reads information from a magnetic medium and generates an m-bit data signal on data bus 191, an erasure pointer signal on line 192, and a codeword reset signal on line 193. Other components of the system include a buffer 194 (RAM); a one byte register 195; a root search and error/erasure magnitude generator 196; an erasure location value generator 197; a timer/controller 198; a decoder circuit 199; a syndrome generator 200; and, an adder 202. The PRML read channel 190 applies the m-bit data on bus 191 both to syndrome generator 200 and to a system bus 203. It also communicates the codeword reset signal on line 193 to syndrome generator 200, erasure location value generator 197, and timer/controller 198. In addition, erasure location value generator 197 receives the erasure pointer signal on line 192.

System bus 203 is connected to buffer 194, to input data bus 191, to an input terminal of register 195, to an output terminal of adder 202, and to a host-connected output bus 204. Buffer 194 has stored therein a plurality of data blocks, each data block comprising a plurality of codewords. Three operations are executed in asynchronous manner: uncorrected data blocks from the PRML read channel 190 fill buffer 194; uncorrected data blocks within buffer 194 are corrected by the invention herein described; and already corrected data blocks within buffer 194 are emptied to the host via output bus 204. These three operations may be executed simultaneously on different sectors in an asynchronously overlapped manner which facilitates on-the-fly operation.

Conventional Sampled Amplitude Read Channel

Figure 3A:
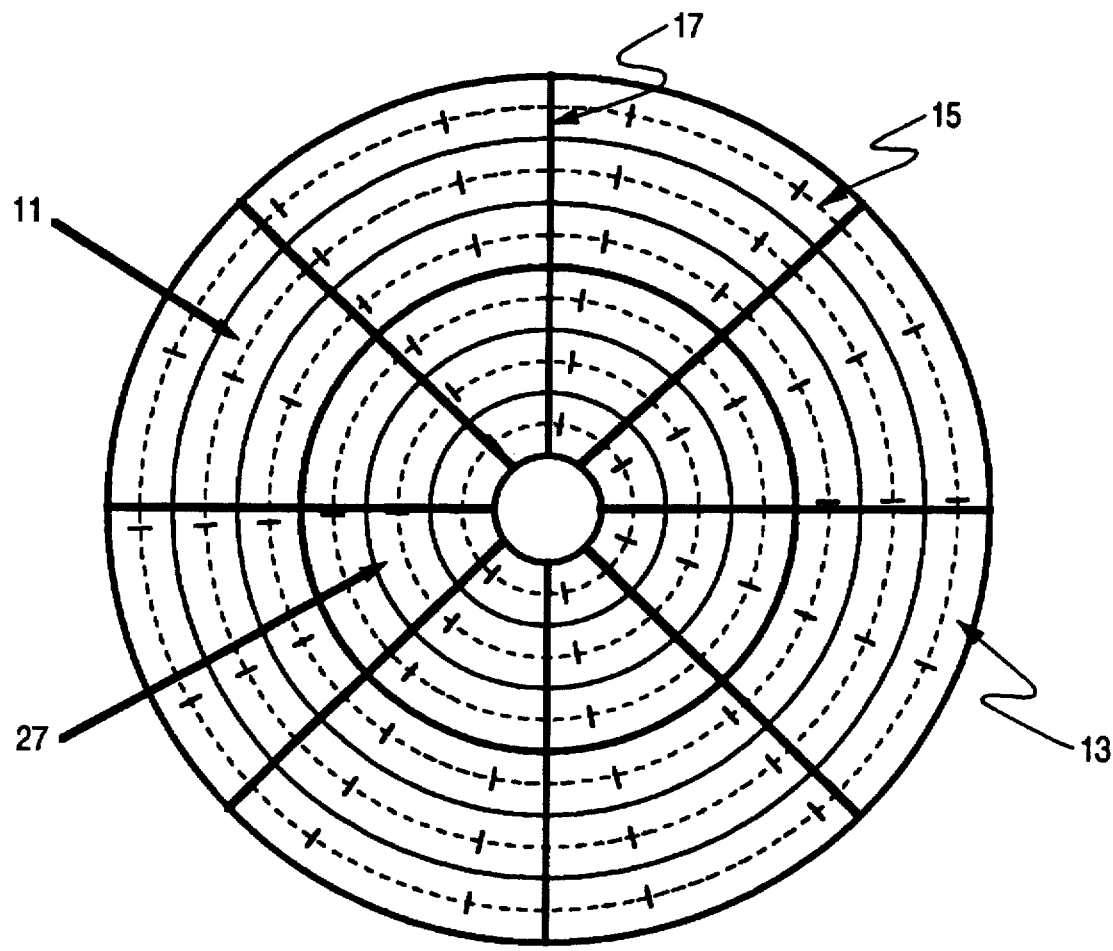
FIG. 3A shows the data format of the magnetic disk comprising a plurality of zoned data sectors and embedded servo wedges.
Figure 3B:
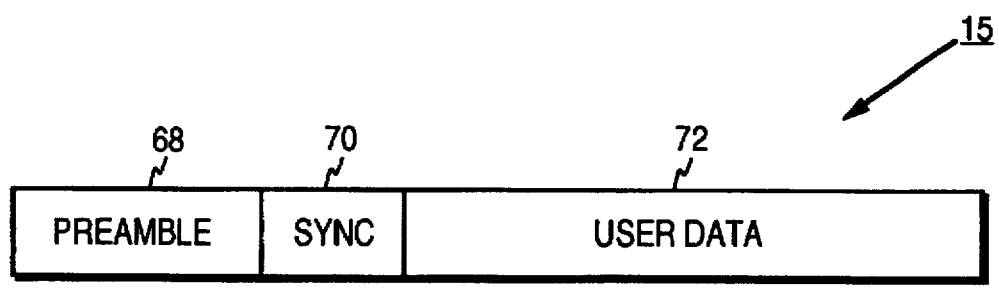
FIG. 3B shows the format of a typical data sector.

Referring now to FIG. 3B, shown is a detailed block diagram of a conventional sampled amplitude read channel and disk drive 190 of FIG. 1. During a write operation, either user data 191 or preamble data from a data generator 4 (for example 2T preamble data) is written onto the media. An RLL encoder 6 encodes the user data 2 into a binary sequence b(n) 8 according to an RLL constraint. A precoder 10 precodes the binary sequence b(n) 8 in order to compensate for the transfer function of the recording channel 18 and equalizing filters to form a precoded sequence ~b(n) 12. The precoded sequence ~b(n) 12 is converted into symbols a(n) 16 by translating 14 ~b(N)=0 into a(N)=−1, and ~b(N)=1 into a(N)=+1. Write circuitry 9, responsive to the symbols a(n) 16, modulates the current in the recording head coil at the baud rate 1/T to record the binary sequence onto the media. A frequency synthesizer 52 provides a baud rate write clock 54 to the write circuitry 9 and is adjusted by a channel data rate signal (CDR) 30 according to the zone the write head is over.

When reading the recorded binary sequence from the media, an AC coupling capacitor 55 removes the DC component from the analog read signal 53 before applying it over line 58 to a variable gain amplifier 22. Before reading the user data, timing recovery 28 first locks to the write frequency by selecting, as the input to the read channel, the write clock 54 through a multiplexor 60. Once locked to the write frequency, the multiplexor 60 selects the signal 19 from the read head as the input to the read channel in order to acquire an acquisition preamble. The variable gain amplifier 22 adjusts the amplitude of the analog read signal 58, and an analog filter 20 provides initial equalization toward the desired response as well as attenuating aliasing noise. A sampling device 24 (normally an analog-to-digital converter (A/D)) samples the analog read signal 62 from the analog filter 20, and a discrete time filter 26 provides further equalization of the sample values 25 toward the desired response.

The equalized sample values 32 are applied to decision directed gain control 51 and timing recovery 28 for adjusting the amplitude of the read signal 58 and the frequency and phase of the sampling device 24, respectively. Timing recovery adjusts the frequency of sampling device 24 over line 23 in order to synchronize the equalized samples 32 to the baud rate. Frequency synthesizer 52 provides a course center frequency setting to the timing recovery circuit 28 over line 64 in order to center the timing recovery frequency over temperature, voltage, and process variations. The channel data rate (CDR) 30 signal adjusts a frequency range of the synthesizer 52 according to the data rate for the current zone. Gain control 51 adjusts the gain of variable gain amplifier 22 over line 21. The equalized samples Y(n) 32 are sent to a discrete time sequence detector 34, such as a maximum likelihood (ML) Viterbi sequence detector, which detects an estimated binary sequence ^b(n) 33. An RLL decoder 36 decodes the estimated binary sequence ^b(n) 33 from the sequence detector 34 into estimated decoded user data 191. A data sync detector 66 detects the sync mark 70 (shown in FIG. 3B discussed below) in the data sector 15 in order to frame the operation of the RLL decoder 36. In the absence of errors, the estimated binary sequence ^b(n) 33 equals the recorded binary sequence b(n) 8, and the decoded user data 191 equals the recorded user data.

To compensate for thermal asperities, a TA detector 40 monitors the sample values 25 from the A/D converter 24. If the sample values saturate, indicating the presence of a TA, then a pole of the AC coupling capacitor 55 is elevated to decrease the TA's time constant (i.e., the decay time). The gain of the analog receive filter 20 is decreased over line 41 in order to increase the headroom of the A/D converter 24, and the target levels of the discrete time sequence detector 34 are adjusted accordingly. The timing recovery 28 and gain control 51 loops are held constant during the duration of the TA over line 42. Once the DC offset in the analog read signal decays to a tolerable level, the gain of the analog receive filter 20 and the target levels of the sequence detector 34 are reset to a normal operating setting. A programmable number of clock cycles after readjusting the signal gain, the timing recovery 28 and gain control 51 loops are re-activated and the read channel continues detecting the digital sequence in normal operation.

Data Format

FIG. 3A shows an exemplary data format of a magnetic media comprising a series of concentric data tracks 13 wherein each data track 13 comprises a plurality of sectors 15 with embedded servo wedges 17. A servo controller (not shown) processes the servo data in the servo wedges 17 and, in response thereto, positions the read/write head over a desired track. Additionally, the servo controller processes servo bursts within the servo wedges 17 to keep the head aligned over a centerline of the desired track while writing and reading data. The servo wedges 17 may be detected by a simple discrete time pulse detector or by the discrete time sequence detector 34. If the sequence detector 34 detects the servo data, then the format of the servo wedges 17 includes a preamble and a sync mark, similar to the user data sectors 15.

FIG. 3B shows the format of a user data sector 15 comprising an acquisition preamble 68, a sync mark 70, and user data 72. Timing recovery uses the acquisition preamble 68 to acquire the correct sampling frequency and phase before reading the user data 72, and the sync mark 70 demarks the beginning of the user data 72 (refer to co-pending U.S. patent application Ser. No. 08/313,491).

Zoned recording is a technique known in the art for increasing the storage density by recording the user data at different rates in predefined zones between the inner diameter and outer diameter tracks. The data rate can be increased at the outer diameter tracks due to the increase in circumferential recording area and the decrease in intersymbol interference. This allows more data to be stored in the outer diameter tracks as is illustrated in FIG. 3A where the disk is partitioned into an outer zone 11 comprising fourteen data sectors per track, and an inner zone 27 comprising seven data sectors per track. In practice, the disk may actually be partitioned into several zones at varying data rates.

Improved Sampled Amplitude Read Channel

Figure 4:
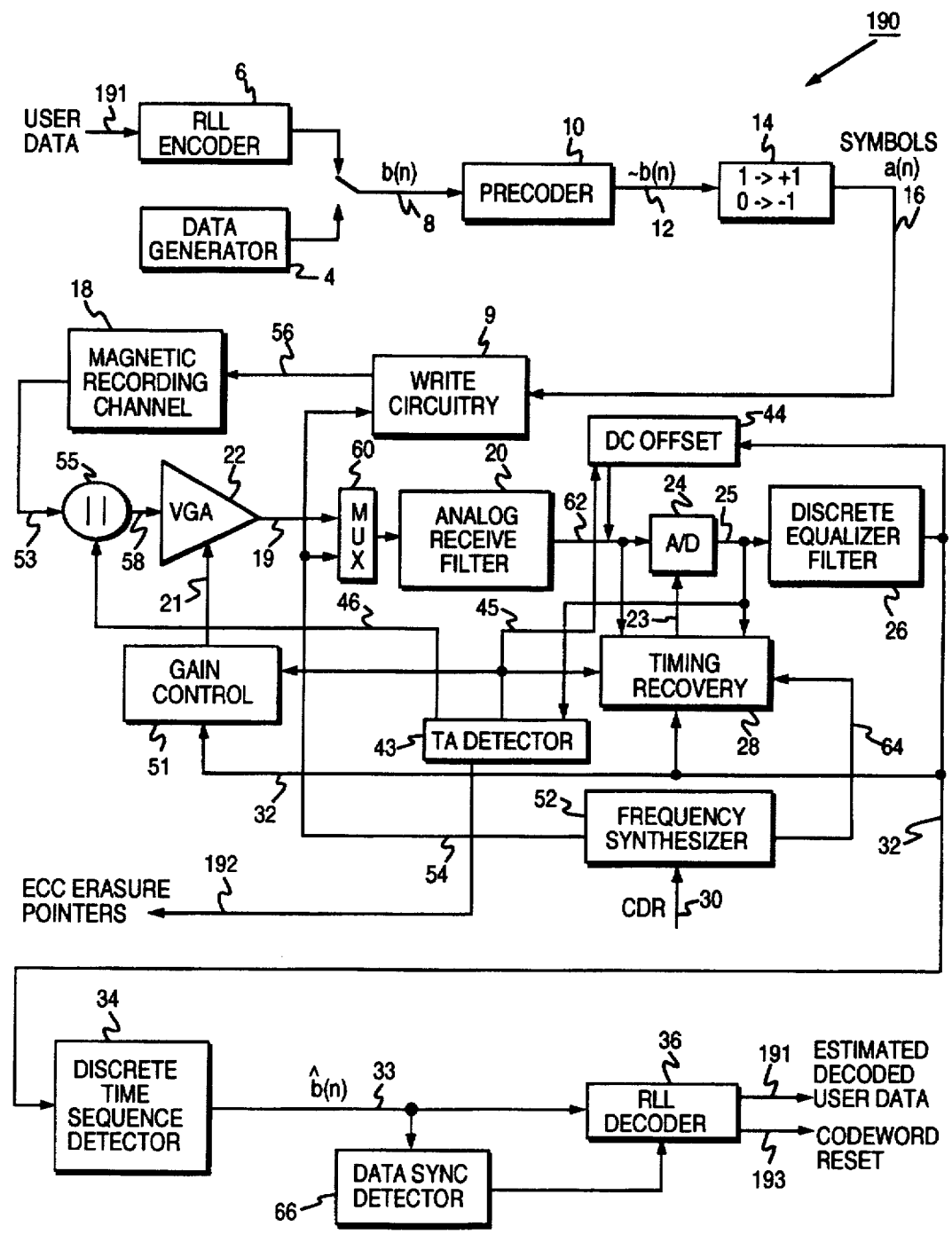
FIG. 4 shows a block diagram of a sampled amplitude read channel comprising the TA compensation method of the present invention.

FIG. 4 illustrates the sampled amplitude read channel comprising the TA compensation method of the present invention. Similar to the prior art, a TA detector 43 detects the occurrence of a thermal asperity by detecting when the A/D sample values 25 saturate. When this occurs, the pole of the AC coupling capacitor 55 is elevated via line 46 to decrease the TA's time constant, but the gain of the analog receive filter 20 and the target settings of the sequence detector 34 are not adjusted. The timing recovery 28, gain control 51, and a DC offset 44 loop are held constant via line 45 for the duration of the thermal asperity. The DC offset circuit 44 attenuates DC drift in the read signal during acquisition and tracking (see the above referenced copending patent application Ser. No. 08/341,723).

Rather than adjust the headroom of the A/D converter 24 and attempt to detect the digital sequence ^b(n) 33 while the DC offset in the analog read signal decays (which results in a number of soft errors), the TA detector 43 of the present invention generates erasure pointers 192 input into a Reed-Solomon decoder circuit 199 as shown in FIG. 1. The decoder circuit 199 uses the erasure pointers 192 to correct the symbols corrupted by the thermal asperity. Erasure pointers decrease the complexity, cost, and redundancy of the Reed-Solomon decoder while still allowing it to operate on-the-fly.

TA Detector

Figure 5:
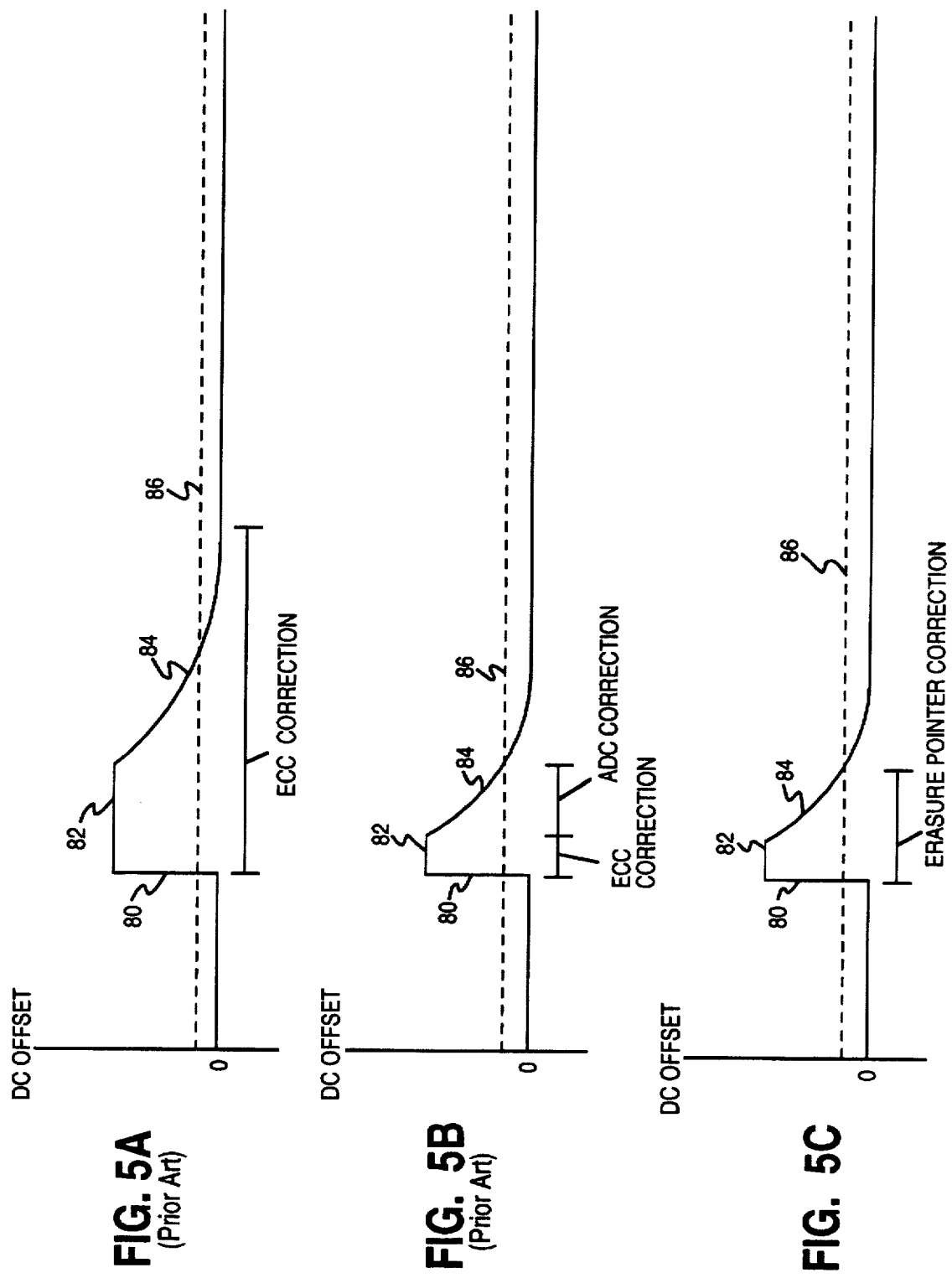
FIG. 5A shows the effect of a thermal asperity on the DC offset of the analog read signal and corresponding data symbols in error that must be corrected using standard ECC techniques in the absence of a TA compensation circuit.
FIG. 5B shows the effect on the DC offset of the analog read signal when thermal asperities are compensated for using a prior art TA compensation technique.
FIG. 5C shows the present invention TA erasure pointer technique which compensates for TA errors on-the-fly without increasing soft errors.
Figure 6:
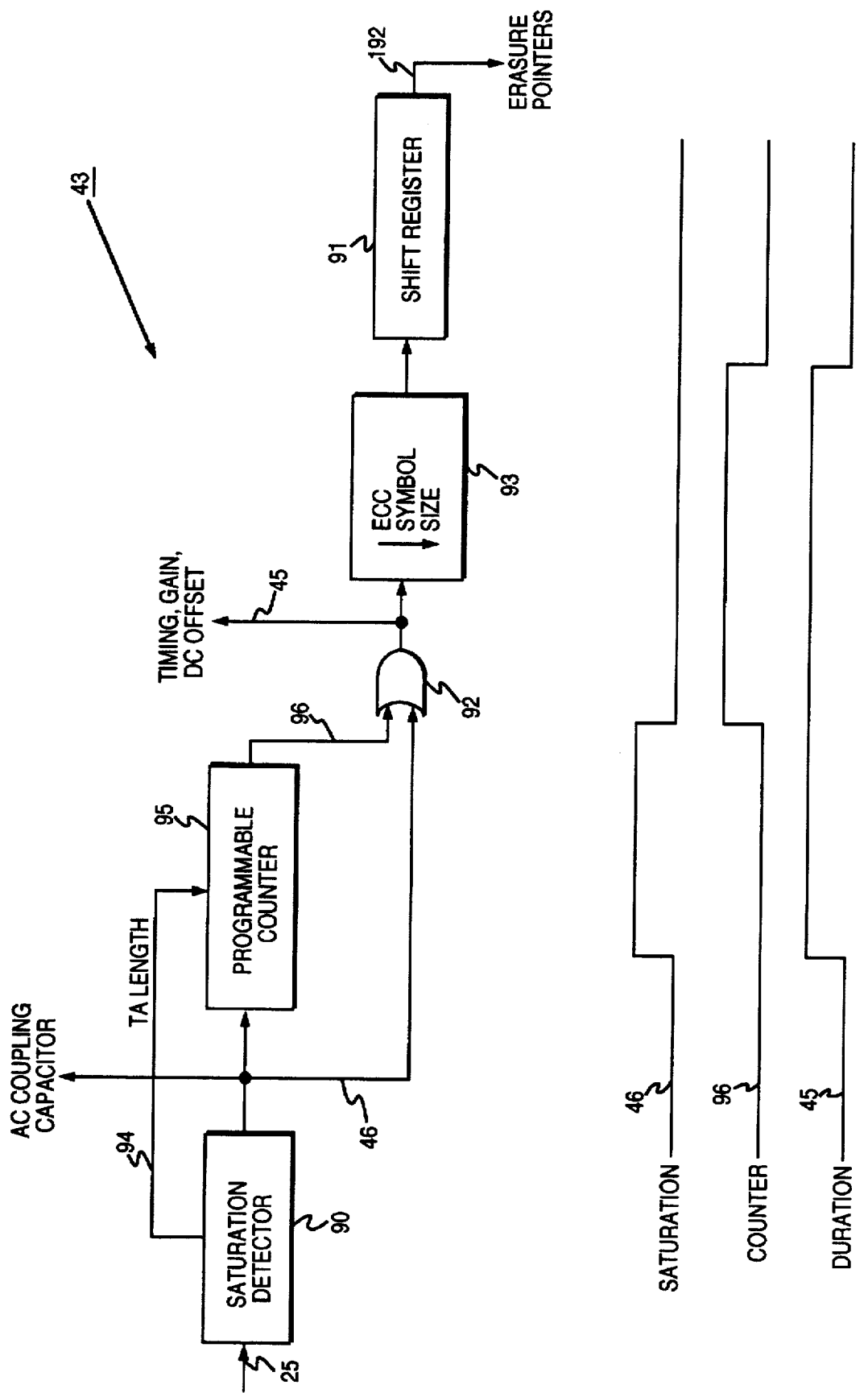
FIG. 6 illustrates details of the present invention's TA detection circuit which detects the occurrence of a thermal asperity.

Referring now to FIG. 6, shown are the details of the TA detector of the present invention and a corresponding timing diagram. A saturation detector 90 monitors the A/D sample values 25 and, when it detects a saturation condition 82 (as shown in FIG. 5C), it generates a control signal 46 for elevating the pole of the AC coupling capacitor 55 and begins shifting "1" bits into a shift register 91 through an OR gate 92 and an ECC symbol size decimation circuit 93. A programmable number of sample periods after the A/D 24 comes out of saturation 82, the saturation detector 90 resets the pole of the AC coupling capacitor 55, loads a TA LENGTH value over line 94 into a programmable counter 95, and enables the counter 95. The TA LENGTH 94 determines the duration of the thermal asperity (in sample periods) and is proportional to the number of sample periods the A/D 24 is saturated (which is a function of the magnitude of the TA and the data rate of the current zone). The output 96 of the counter is input into the OR gate 92 to continue shifting "1" bits into the shift register 91 for each ECC symbol corrupted by the TA. A hold signal 45 at the output of the OR gate 92 holds the timing recovery 28, gain control 51, and the DC offset 44 loops constant during the duration of the thermal asperity. When the counter 95 reaches terminal count, the gain control, timing recovery and DC offset loops are re-activated.

Before detecting a thermal asperity, the content of the shift register 91, which comprises a number of single bit delay/storage elements, is cleared. The length of the shift register 91 is sufficient to store the number of symbols corrupted by the TA (i.e., the duration of the TA in sample periods divided by the ECC symbol size) and a predetermined number of additional delay/storage elements in order to synchronize the output of the shift register 91 (a "1" bit output represents an erasure pointer 192) to the output 191 of the RLL decoder 36. That is, the erasure pointers are delayed so that they are correctly aligned with the corresponding corrupted ECC symbols input into the syndrome generator 200 of the Reed-Solomon decoder 300 shown in FIG. 1.

ECC System Overview

With error-correction coding, the data to be stored onto the disk is processed to obtain additional data symbols (called check symbols or redundancy symbols). The data and check symbols together make up a codeword or sector. When reading from the disk, the codeword is mathematically processed to obtain error syndromes which contain information about locations and values of errors.

The Reed-Solomon codes are a class of multiple-error correcting codes. One of the most popular methods of decoding is to generate the error locator polynomial σ(x) [i.e the connection polynomial using the Berlekamp-Massey algorithm]; generate the error evaluator polynomial ω(x) from the error locator polynomial; perform a root search for the error locator polynomial to detect error locations; and then evaluate the error evaluator polynomial at the error locator polynomial root to calculate an error value.

Most logic circuits for error detection and correction implement the Berlekamp-Massey algorithm. Each iteration of the Berlekamp-Massey algorithm has two parts or stages:

1) calculate $d_n$:  $d_n = \Sigma \sigma_b S_{n-k}$ 2) update σ: $\sigma^{(n+1)}(x) = \sigma^{(n)}(x) - d_n d_r^{-1} x \tau^{(n)}(x)$ update τ: $\tau^{(n+1)}(x) = x\tau^{(n)}(x)$ or $\sigma^{(n)}(x)$ As used herein, $d_n$ is a discrepancy number and τ is an intermediate polynomial used in calculating. The choice of the two alternate expressions for τ depends on whether or not the σ(x) update results in an increase in the order of σ(x). When an increase results, τ(x) is set to σ(x) and $d_r$ is set to $d_n$. If τ(x) is instead set to $d_n^{-1} x\sigma(x)$, then $d_r$ can be eliminated and the recursions become:

EQUATIONS. 1:
1) calculate $d_n$:  $d_n = \Sigma \sigma_b S_{n-k}$ 2) update σ: $\sigma^{(n+1)}(x) = \sigma^{(n)}(x) - d_n \tau^{(n)}(x)$ update τ: $\tau^{(n+1)}(x) = x\tau^{(n)}(x)$ or $\tau^{(n+1)}(x) = d_n^{-1} x\sigma^{(n)}(x)$ and $d_r = d_n$ The second stage requires the result of the first stage. To minimize circuitry size it is desirable to perform all arithmetic in a serial manner and to make updates in a serial manner (as opposed to a parallel manner requiring space-consuming parallel buses). Assuming the field used is $GF(2^m)$, the minimum number of clock cycles needed for a serialized implementation is 2 m clocks per iteration, i.e. m clocks per stage.

U. S. Pat. No. 4,845,713, issued Jul. 4, 1989 to Zook, shows a method which uses 2m+1 clocks per iteration and bit-serial multipliers and adders. However, it uses 4t+1 m-bit registers and a $2^m \times m$ ROM look-up table for inversion (t being the number of correctable errors). Also, the update for $\tau^{(n+1)}$ (x) is done in a parallel manner.

Various decoding methods are described in Whiting's PhD dissertation for the California Institute of Technology entitled "Bit-Ser. Reed-Solomon Decoders in VLSI," 1984. Whiting's preferred implementation uses the following modified set of recursion equations:

EQUATIONS 2:
1) calculate $d_n$: $\quad d_n = \Sigma \sigma_k S_{n-k}$
2) update $\sigma$: $\quad \sigma^{(n+1)}(x) = \sigma^{(n)}(x)$ or $\sigma^{(n+1)}(x) = d_n^{-1}\sigma^{(n)}(x) - x\tau^{(n)}(x)$ update $\tau$: $\quad \tau^{(n+1)}(x) = x\tau^{(n)}(x)$ or $\tau^{(n+1)}(x) = d_n^{-1}\sigma^{(n)}(x)$ Whiting's implementation can perform an iteration in 2 m clocks if a $2^m \times m$ ROM look-up table is used for inversion. The updates can be done serially, but $d_n^{-1}$ must be parallel bussed to each multiplier. Whiting's overall implementation would use 5(t+1) m-bit registers. The reason that the number of registers is proportional to t+1 instead of t is because $\sigma_0$ is not identically equal to 1, i.e. the $\sigma(x)$ generated by EQUATIONS 2 is the $\sigma(x)$ generated by EQUATIONS 1 multiplied by some constant. Whiting also mentions using the following modified set of recursion equations:

EQUATIONS 2A:
1) calculate $d_n$: $\quad d_n = \Sigma \sigma_k S_{n-k}$
2) update $\sigma$: $\quad \sigma^{(n+1)}(x) = d_r\sigma^{(n)}(x) - xd_n\tau^{(n)}(x)$ update $\tau$: $\quad \tau^{(n+1)}(x) = x\tau^{(n)}(x)$ or $\tau^{(n+1)}(x) = \sigma^{(n)}(x)$ Whiting's second method uses no inversions, but for serial updates it requires 6(t+1)+2 m-bit registers and $d_n$ and $d_r$ must be parallel bussed to each multiplier.

All known implementations for the Berlekamp-Massey algorithm use some combination of a $2^m \times m$ ROM, symbol-wide signal paths, and an excessive number of m-bit registers in order to perform an iteration in 2 m clock cycles. An inherent problem with all of the above sets of iteration equations is that $\sigma^{(n+1)}$ (x) depends on $\tau^{(n)}$ (x) and, in turn, $\tau^{(n+1)}(x)$ depends on $\sigma^{(n)}(x)$. Since one or both of them depend upon $d_n$, consequentially $d_n$ must be calculated during the first m clock cycles and then $\sigma^{(n+1)}$ (x) and $\tau^{(n+1)}$ (x) must both be calculated during the second m clock cycles. This implies the need for temporary storage for one or both of $\sigma^{(n)}$ (x) and $\tau^{(n)}$ (x) when used in multiplications to produce $\sigma^{(n+1)}$ (x) or $\tau^{(n+1)}$ (x). Thus there is a need for a more efficient method.

The Reed-Solomon decoder of the present invention processes a codeword containing n m-bit symbols to determine coefficients of an error locator polynomial $\sigma(x)$, and thereafter generates an error evaluator polynomial $\omega(x)$. The decoder comprises a bank of syndrome registers for storing syndrome values; a bank of error locator registers for accumulating therein coefficients of an error locator polynomial $\sigma(x)$; a bank of intermediate registers for accumulating therein coefficients of an intermediate polynomial $\tau(x)$. The decoder further includes a register update circuit which, for a given codeword, conducts t number of error locator iterations in order to update values in the error locator registers and the intermediate registers. Each error locator iteration includes two phases, specifically a first phase or phase A and a second phase or phase B. Each phase comprises m clock cycles. Upon completion of the error locator iterations, two-phased error evaluator iterations are conducted to determine coefficients of the error evaluator polynomial $\omega(x)$ which are stored in the intermediate registers.

In contrast to prior art techniques wherein coefficients of the error locator polynomial $\sigma(x)$ and coefficients of the intermediate polynomial $\tau(x)$ are both updated during the same phase (e.g., the second phase of an error locator iteration), the register update circuit of the present invention updates coefficients of the intermediate polynomial $\tau(x)$ during the first phase of each error locator iteration, and updates coefficients of the error locator polynomial $\sigma(x)$ during the second phase of each error locator iteration. A current discrepancy value $d_n$, required for updating the coefficients of the error locator polynomial $\sigma(x)$, is also obtained during the first phase of each error locator iteration.

The decoder of the present invention thus implements the following recursion rules:

PHASE A:
update $\tau$: $\quad \tau^{(n)}(x) = x\tau^{(n-1)}(x)$ or $\tau^{(n)}(x) = x(\tau^{(n-1)}(x) + d_{-1}^{-1}\sigma^{(n)}(x))$ calculate $d_n$: $\quad d_n = \Sigma \sigma_k S_{n-k}$ PHASE B:
update $\sigma$: $\quad \sigma^{(n+1)}(x) = \sigma^{(n)}(x) - d_n\tau^{(n)}(x)$ The register update circuit includes a discrepancy determination circuit for determining, during the first phase of each error locator iteration, the current discrepancy $d_n$. The discrepancy determination circuit adds multiplicative products from a plurality of "slices" to obtain the current discrepancy $d_n$. Each slice comprises one of the syndrome registers, one of the error locator registers, one of the intermediate registers, and one modified syndrome register.

The multiplicative product of each slice is generated by a discrepancy-generating inner product generator circuit. The discrepancy-contributing inner product generator circuit of a slice takes the inner product of the modified syndrome register of the slice (in second or β basis representation) and the contents of the intermediate register of the slice (in first or α basis representation). The product of two elements of $GF(2^m)$, where one element is represented in the standard or α basis and one element is represented in the dual or β basis, can be produced serially, i.e. one output bit per clock, by taking the inner product of the two elements and multiplying one of the elements by α on each clock. Thus, in connection with the inner product generated by the discrepancy-contributing inner product generator circuit, the modified syndrome register initially receives the syndrome value of its corresponding syndrome register, but is updated to contain an α-multiple of the syndrome value by virtue of a multiplier feedback circuit connected around each modified syndrome register. Thus, each multiplicative product (i.e., the multiplicative product produced by a slice) is derived from a first term (the coefficient of the error locator register of the slice) and a second term (an α-multiple of the syndrome value of the slice [the α-multiple being stored in the modified syndrome register]). These first and second terms are multiplied by the discrepancy-contributing inner product circuit included in the slice.

The register update circuit also includes a discrepancy inversion circuit which determines an inverse of the current discrepancy (i.e., $d_n^{-1}$) in first basis representation. This inverse becomes the inverse of a prior discrepancy (.i.e., $d_{n-1}^{-1}$ in an immediately succeeding error locator iteration). The discrepancy inversion circuit does not utilize a ROM-stored look up table, but instead serially receives the discrepancy in the second basis representation and generates its inverse.

The register update circuit also includes a discrepancy register DM which selectively has stored therein the inverse of the prior discrepancy (i.e., $d_{n-1}^{-1}$) during the first phase of each error locator iteration and the current discrepancy ($d_n$) during the second phase of each error locator iteration. Both the inverse of the prior discrepancy (i.e., $d_{n-1}^{-1}$) and the current discrepancy ($d_n$) are stored in the discrepancy register in first basis (i.e., $\alpha$ basis) representation, the prior discrepancy (i.e., $d_{n-1}^{-1}$) having been generated in the first basis representation by the discrepancy inversion circuit and the current discrepancy ($d_n$) having been converted from second basis (i.e., $\beta$ basis) representation to first basis representation by a conversion circuit for converting $d_n$ from a second basis representation to a first basis representation.

The register update circuit also includes an updating multiplier or inner product circuit which, during the first phase of each error locator iteration, selectively multiplies a value derived from the inverse of the prior discrepancy ($d_{n-1}^{-1}$), e.g., an $\alpha$-multiple of $d_{n-1}^{-1}$ [stored in the discrepancy register during the first phase of the error locator iteration] by the coefficients in the error locator registers to obtain values for use in updating the coefficients stored in the intermediate registers. Thereafter (e.g., during the second phase of each error locator iteration), the updating multiplier circuit multiplies a value derived from the current discrepancy $d_n$, e.g., an $\alpha$-multiple of $d_n$ [stored in discrepancy register during the second phase of the error locator iteration] by the coefficients in the intermediate registers to obtain values for updating the coefficients stored in the error locator registers. The $\alpha$-multiple of the current discrepancy $d_n$ is obtained by a multiplier feedback circuit connected to the discrepancy register for repetitively multiplying the value in the discrepancy register by the field element.

Importantly, in contrast to prior art techniques, the decoder of the present invention requires only one bank of error locator registers and one bank of intermediate registers. Prior art techniques of necessity included two banks of error locator registers: a first bank for maintaining the updated (new) coefficients of the error locator polynomial and a second bank for storing the old coefficients of the error locator polynomial (which were used to update the coefficients of the intermediate polynomial). Similarly, the prior art technique employed two banks of intermediate registers: a first bank for maintaining the new (updated) coefficients of the intermediate polynomial and a second bank for storing the old coefficients of the intermediate polynomial (which were used to update the coefficients of the error locator polynomial). Thus, the decoder of the present invention advantageously eliminates two banks of registers. In addition, the decoder of the present invention facilitates serial data shifting rather than parallel data transfer, thereby reducing circuit real estate which would otherwise be increased by parallel bus structure.

Reed-Solomon Decoder

Referring again to FIG. 1, a decoder circuit 199 receives t m-bit syndromes from a syndrome generator 200 and m-bit erasure location values from an erasure location value generator 197. In addition, the operation of the decoder circuit 199 is sequenced by signals applied thereto by a timer/controller 198. After a series of error locator iterations, the decoder circuit 199 obtains final values for the t m-bit coefficients of the error locator polynomial. Upon completion of the series of error locator iterations for a codeword, the decoder circuit 199 executes a series of error magnitude iterations to generate an error evaluator polynomial for the codeword. The coefficients of the error evaluator polynomial are transmitted to a root search and error/erasure magnitude generator 196 where an error/erasure magnitude E is calculated. After calculating the error/erasure magnitude E, it is added to the original data at adder 202, resulting in the corrected byte. In the buffering scheme herein illustrated, the corrected byte is then returned to buffer 194.

The product of two elements of $GF(2^m)$, where one element is represented in the standard (or $\alpha$ basis) and one element is represented in the dual (or $\beta$ basis), can be produced serially, i.e. one output bit per clock, by taking the inner product of the two elements and multiplying one of the elements by $\alpha$ on each clock. Accordingly, as used herein, such values as the syndromes, the current discrepancy $d_n$, and the prior discrepancy $d_{n-1}$ are represented in the $\alpha$ basis while such values as the coefficients of $\sigma(x)$ and $\tau(x)$ are represented in the $\beta$ basis. Such representation allows all of the multiplications of EQUATIONS 3 (hereinafter discussed) to be performed serially using inner products.

Figure 7:
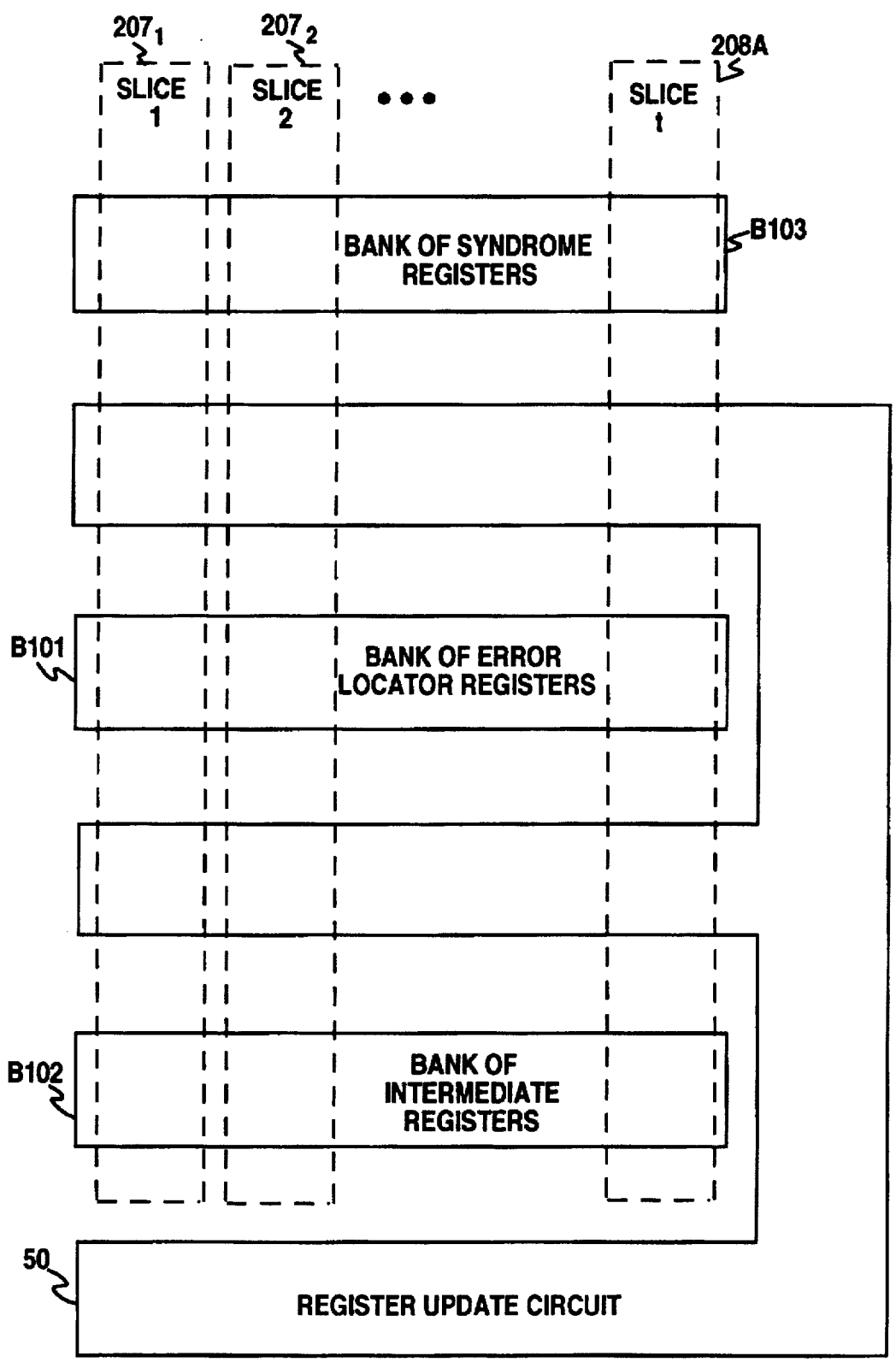
FIG. 7 and FIG. 7A show a schematic view of a decoder circuit according to an embodiment of the invention (which operates in an errors and erasure mode) along with a syndrome generator and which incorporates erasure correction.

FIG. 7 is a block diagram of decoder circuit 199 generally. Decoder circuit 199 comprises a bank B101 of error locator or $\sigma$ registers; a bank B102 of intermediate or $\tau$ registers; a bank B103 of syndrome registers; and, a register update circuit 50. Details of differing embodiments of decoder circuit 199 are provided with respect to FIGS. 7A and 7B. It will subsequently be seen that portions of decoder circuit 199 form a plurality of "slices" $207_1, 207_2, \ldots 207_{t-1}, 208A$. The slices are discussed in more detail below, particularly with reference to FIGS. 8A–8D.

Figure 7A:
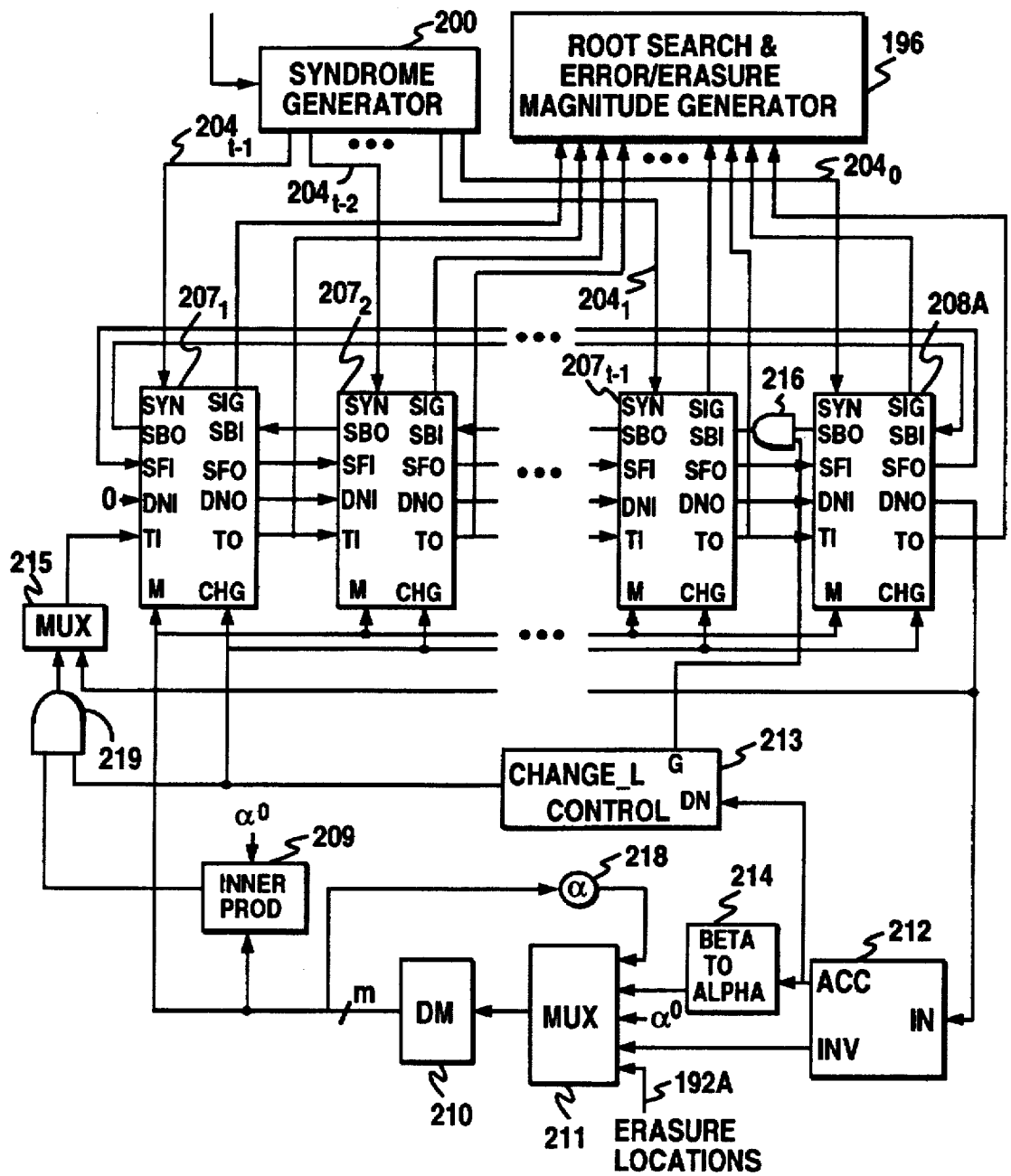
Figure 7B:
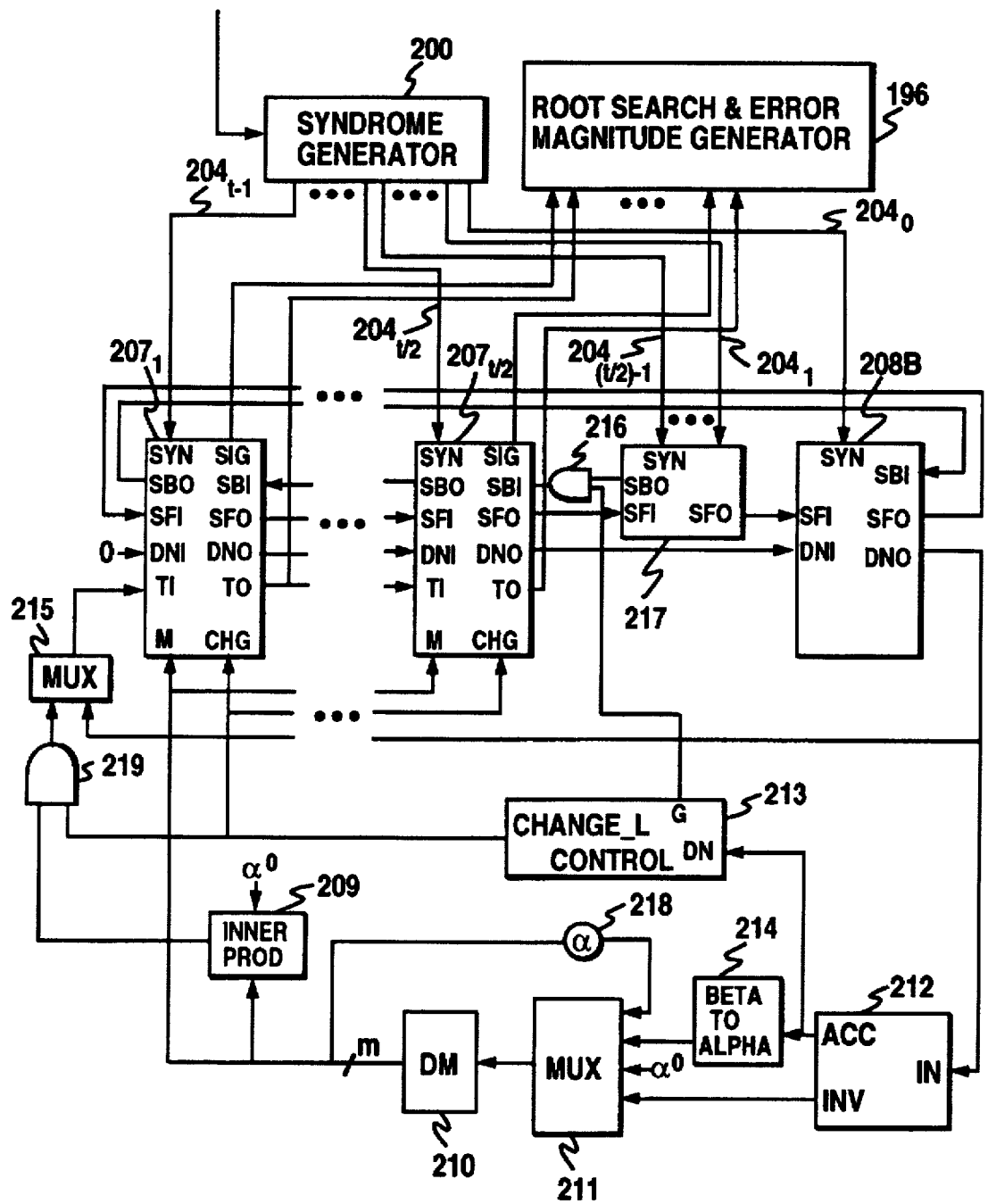
FIG. 7B is schematic view of a decoder circuit according to an embodiment of the invention (which operates in an errors only mode) along with a syndrome generator and error/locator generator and which does not incorporate erasure correction.

Decoder circuit 199 operates in one of two modes: decoding of errors and erasures (errors and erasures mode), or decoding of errors only (errors only mode). FIG. 7A shows details of the decoder circuit for the errors and erasures mode, and FIG. 7B shows details of the decoder circuit for the errors only mode. Decoder circuit 199 of FIG. 7A can simultaneously correct u errors and v erasures (errors whose locations are known) as long as 2u+v is not greater than t.

FIG. 7A shows signals which are input to and output from slices $207_k$ and 208A in an errors and erasures mode. These signals include the following m-bit signals:

SYN—syndrome data signal;

SBO—syndrome shifted backwards output signal;

SBI—syndrome shifted backwards input signal;

SFI—syndrome shift forward input signal;

SFO—syndrome shift forward output signal

TI—$\tau$ input signal TI;

TO—$\tau$ output signal TO;

M—discrepancy-related input signal M;

DNI—a one bit discrepancy-forming input signal input into each slice $207_k$, 208A;

DNO—a one bit discrepancy-forming output signal output from each slice $207_k$, 208A; and SIG—a one bit coefficient output line SIG connected from each slice to error locator generator 203 so that output from error locator register 101 can be serially outputted.

FIG. 7A shows some of the elements included in register update circuit 50 of FIG. 7. These elements include an inner product circuit 209; a discrepancy-related register DM 210; a DM register-controlling MUX 211; a discrepancy inversion circuit 212; a controller 213; a β to α basis conversion circuit 214; a TI input-controlling MUX 215; a zero backward fill AND gate 216; a multiplier feedback circuit 218; and a first slice τ-AND gate 219. Yet other elements included in register update circuit 50 include the non-register components of slices $207_k$ and 208A, which are discussed below.

As shown in FIG. 7A, output signal DNO from slice 208A is applied both to an input of discrepancy inversion circuit 212 and to a first input pin of MUX 215. Discrepancy inversion circuit 212 has two m-bit output ports: a first output port labeled ACC, and a second output port labeled INV. As hereinafter described, a current discrepancy value $d_n$ (in β basis representation) is output from port ACC during the first phase of an error locator iteration. From port ACC the current discrepancy value $d_n$ is applied both to input pin DN of controller 213 and to β to α basis conversion circuit 214. Upon completion of a second phase of an error locator iteration, discrepancy inversion circuit 212 outputs an inverted value of the discrepancy $(d_n^{-1})$ determined during the first phase, which inverted value then becomes an inverted prior discrepancy (e.g., $d_{n-1}^{-1}$) during the first phase of the next iteration.

Figure 12:
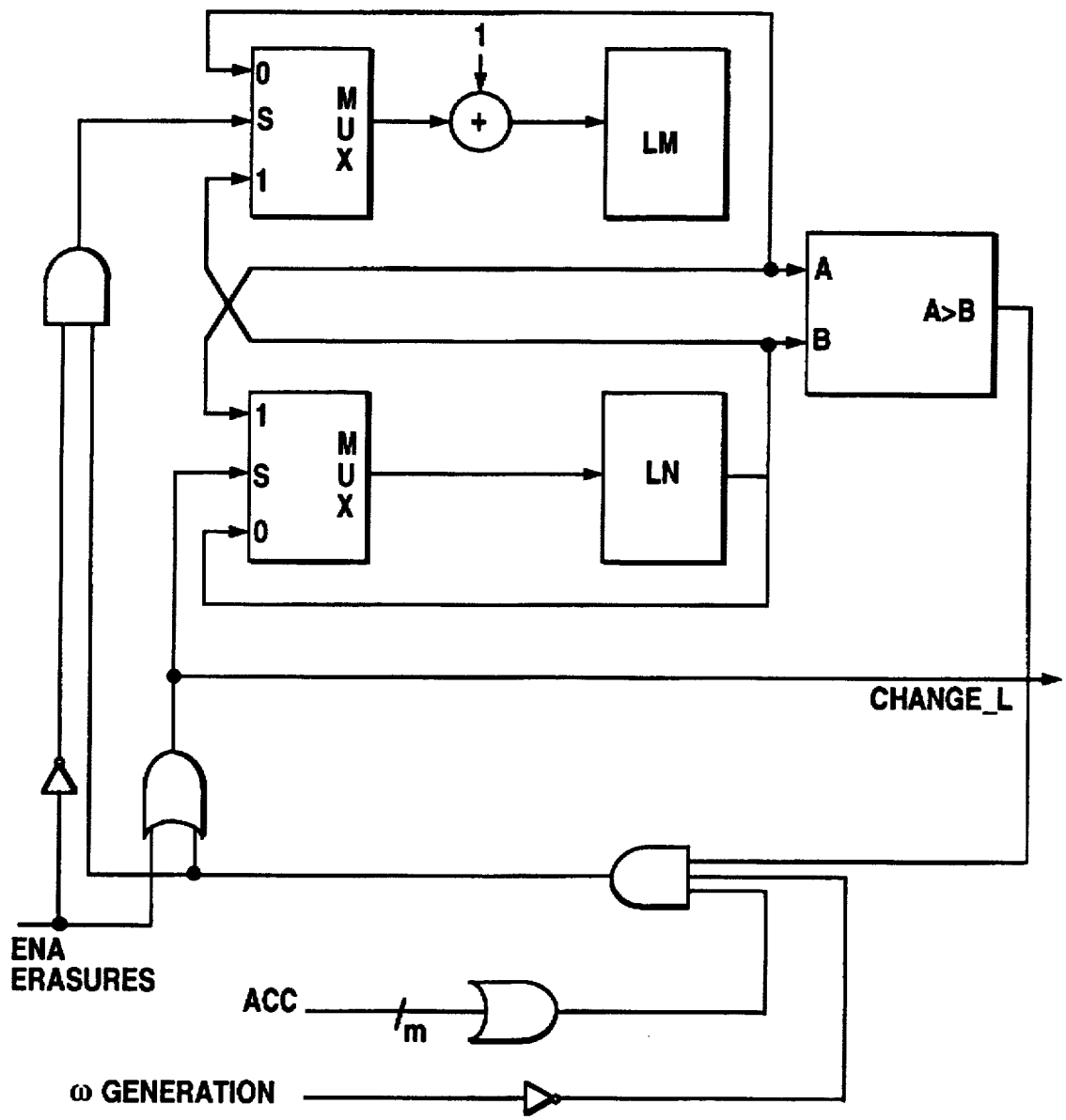
FIG. 12 is a schematic view of portions of a controller according to an embodiment of the invention.
Figure 13:
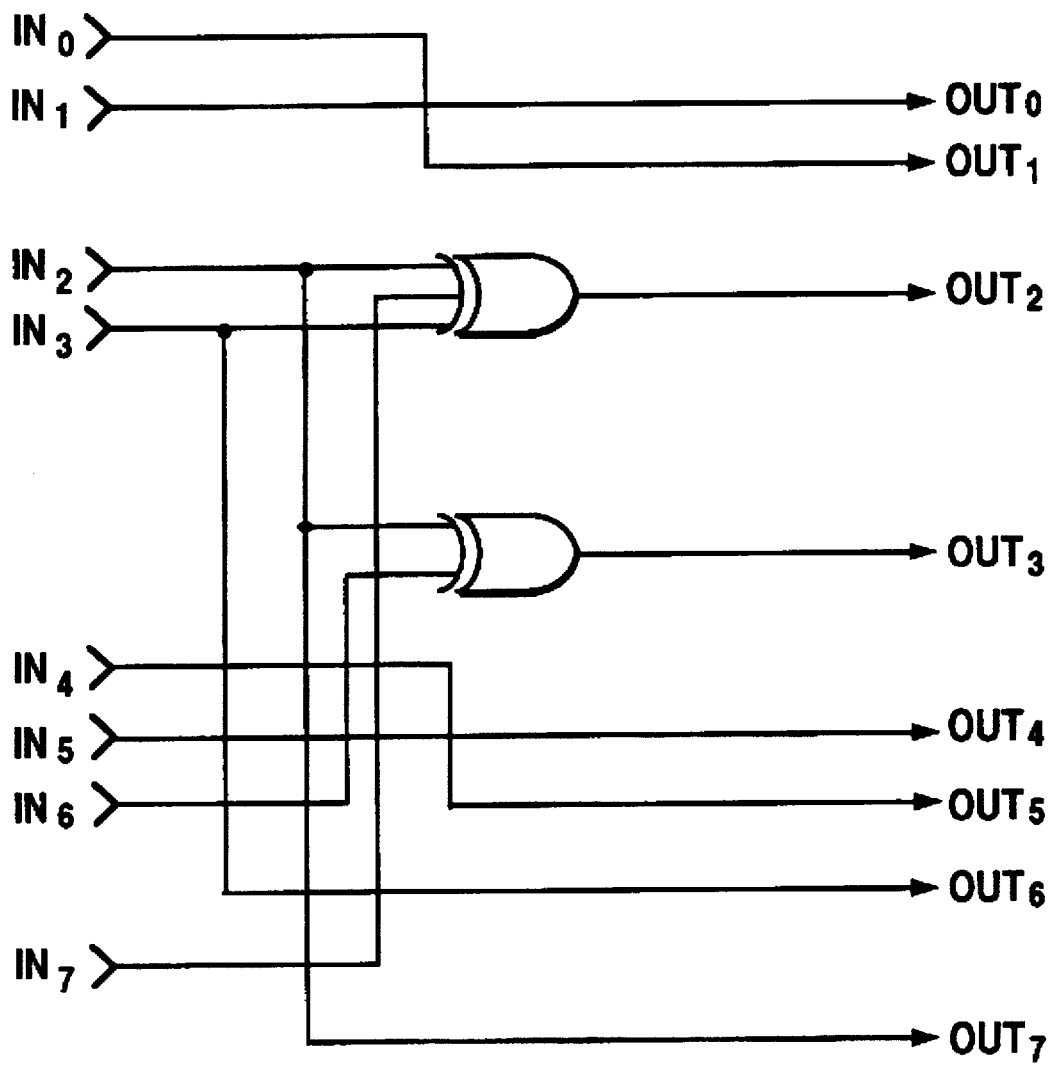
FIG. 13 is a schematic view of a circuit which translates from the dual (e.g., second) basis to the standard (e.g., first) basis.

Controller 213 uses the non-converted current discrepancy value $d_n$ obtained from circuit 212 to generate signals G and CHANGE_L in the manner depicted in FIG. 12. Signal CHANGE_L is applied to a first input pin of AND gate 219 and to slices $207_k$ and 208A in the manner depicted in FIGS. 8A, 8B, and 8C. Signal CHANGE_L refers to a change in the length of the connection polynomial, which is understood by those skilled in the art.

DM-register controlling MUX 211 receives a plurality of selectable m-bit inputs, including the current discrepancy (in α-basis representation from basis conversion circuit 214); the inverted prior discrepancy $d_{n-1}^{-1}$ (from inversion circuit 212); the value $α^0$; erasure location values (from erasure location value generator 197); and, an α-multiple of the contents of DM register 210 (from multiplier feedback circuit 218). DM-register controlling MUX 211 is, in turn, controlled by timer/controller 198 which selects among the possible inputs in accordance e.g. with the iteration phase.

An output port of DM-register controlling MUX 211 is connected to an input port of DM register 210. An output port of DM register 210 is connected to the multiplier feedback circuit 218; to a first input of inner product circuit 209; and to slices $207_k$ and 208A in the manner illustrated by FIGS. 8A and 8B. Inner product circuit 209 receives $α^0$ as a second input and generates an output signal for application to a second pin of first slice τ-AND gate 219.

The errors only decoding circuit of FIG. 7B differs slightly from the errors and erasures decoding circuit of FIG. 7A. In particular, for the errors only mode of FIG. 7B, slices $207_{(t/2)-1}$ through $207_{t-1}$ form a collective slice circuit 217 and DM-register controlling MUX 211 does not receive erasure location values.

It is understood from FIGS. 7 and 7A, for example, that decoding circuit 199 comprises t number of slices, in particular nominal slices $207_k$ and terminator slice 208A. Slices 207 and 208A are connected together in the manner shown in FIG. 7A for the errors and erasures mode and in the manner shown in FIG. 7B for the errors only mode. In both modes, slice $207_k$ is representative for slice k for k=1,2, . . . , t−1 and 208A represents slice t.

Figure 8A:
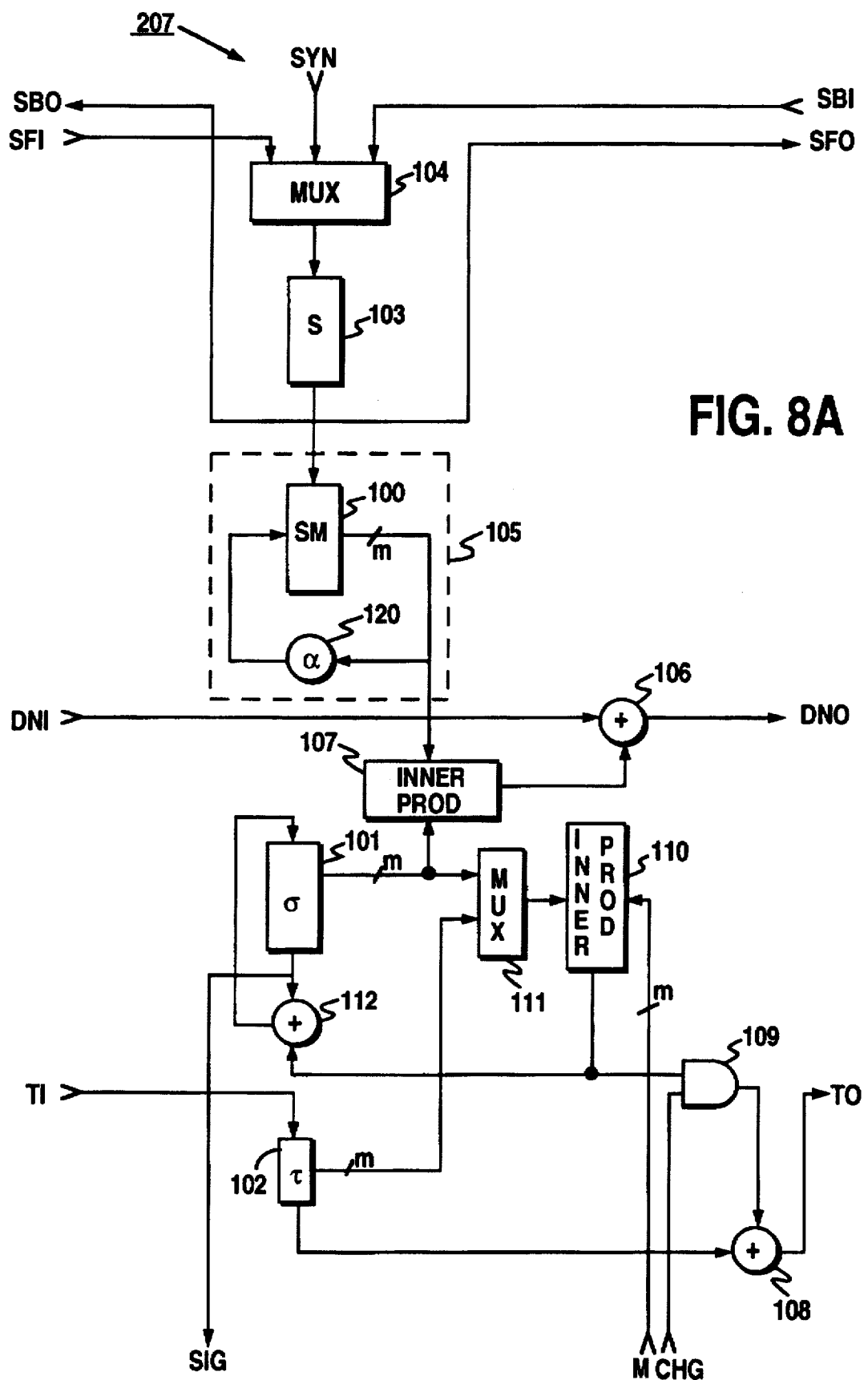
FIG. 8A is a schematic view of a slice of a decoder circuit (errors and erasures mode) according to an embodiment of the invention.
Figure 8B:
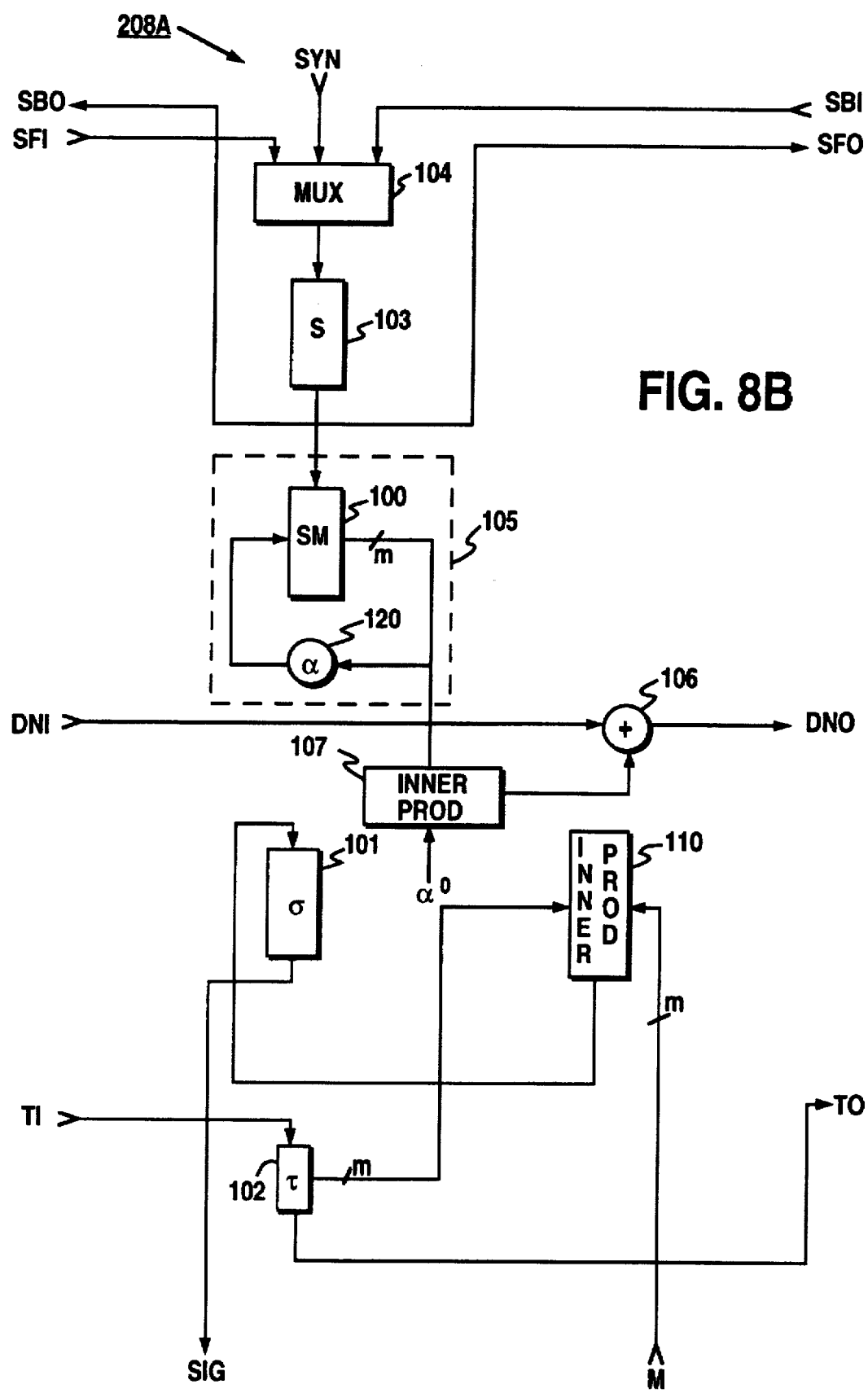
FIG. 8B is a schematic view of a terminal slice of a decoder circuit (errors and erasures mode) according to an embodiment of the invention.
Figure 8C:
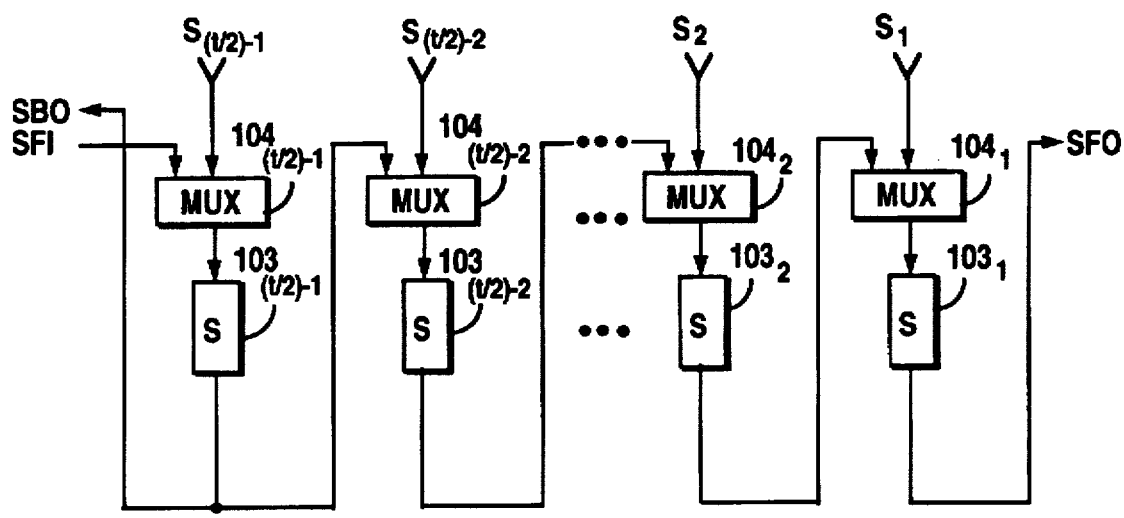
FIG. 8C is a schematic view of a collective slice circuit of a decoder circuit (errors only mode) according to an embodiment of the invention.
Figure 8D:
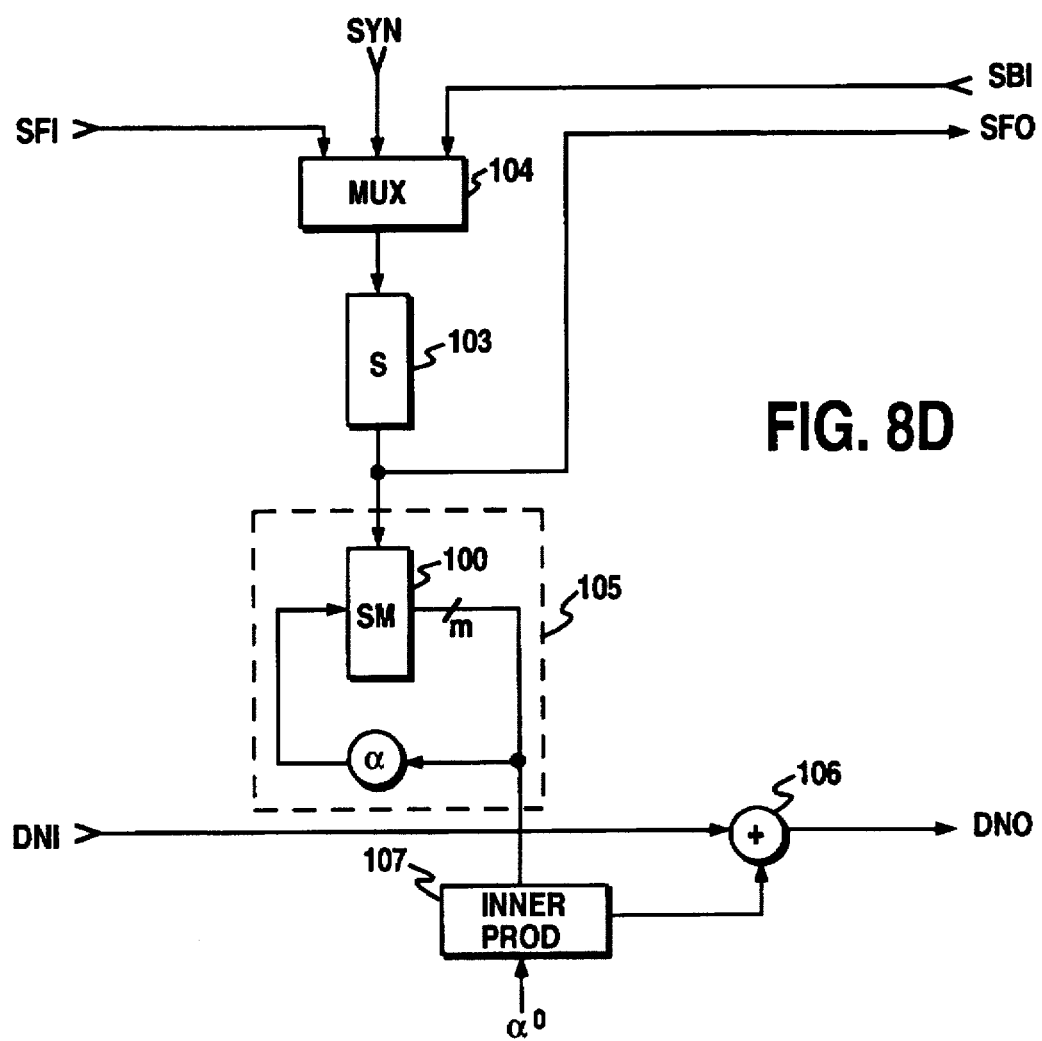
FIG. 8D is a schematic view of a terminal slice of a decoder circuit (errors only mode) according to an embodiment of the invention.

FIG. 8A shows details of slices $207_k$ for the errors and erasure mode and FIG. 8B shows details of slice 208A for the errors and erasures mode. In the errors only mode of FIG. 7B, slice $207_1$ through and including slice $207_{t/2}$ are identical to the slices $207_k$ illustrated in FIG. 8A. However, for the errors only mode, slices $207_{(t/2)-1}$ through $207_{t-1}$ form the collective slice circuit 217, shown in FIG. 8C, and slice 208B is as shown in FIG. 8D.

FIG. 8A shows that slices $207_k$ comprise registers 101, 102, and 103. As also shown in FIG. 8A, syndrome register 103 is loaded via a MUX 104 with syndrome data either from syndrome generator 200 (signal SYN) or from a syndrome register in one of two adjacent slices (using either signal SFI or signal SBI). A select pin of MUX 104 is controlled by timer/controller 198 in accordance with iteration number, phase of iteration, and type of iteration. Error locator registers 101 and intermediate registers 102 are all initialized to zero.

Other components of slices $207_k$ are included in register update circuit 50, in particular: modified-syndrome multiplication circuit 105; adder 106; discrepancy-contributing inner product circuit 107; adder 108; τ-output AND gate 109; an updating multiplier or inner product circuit 110; coefficient selecting-MUX 111; and adder 112. As with other MUXes described herein, coefficient selecting-MUX 111 is controlled by timer/controller 198 in accordance with iteration number, phase of iteration, and type of iteration.

A multiplicative product of each slice is generated by discrepancy-generating inner product generator circuit 107. Discrepancy-contributing inner product generator circuit 107 of a slice takes the inner product of the modified syndrome register 100 of the slice (in first or α basis representation) and the contents of the intermediate register 102 of the slice (in second or β basis representation). The product of two elements of $GF(2^m)$, where one element is represented in the standard or α basis and one element is represented in the dual or β basis, can be produced serially, i.e. one output bit per clock, by taking the inner product of the two elements and multiplying one of the elements by α on each clock. Thus, in connection with the inner product generated by the discrepancy-contributing inner product generator circuit 107, the modified syndrome register 100 initially receives the syndrome value of its corresponding syndrome register 103, but is updated to contain an α-multiple of the syndrome value by virtue of multiplier feedback circuit 105.

Figure 9:
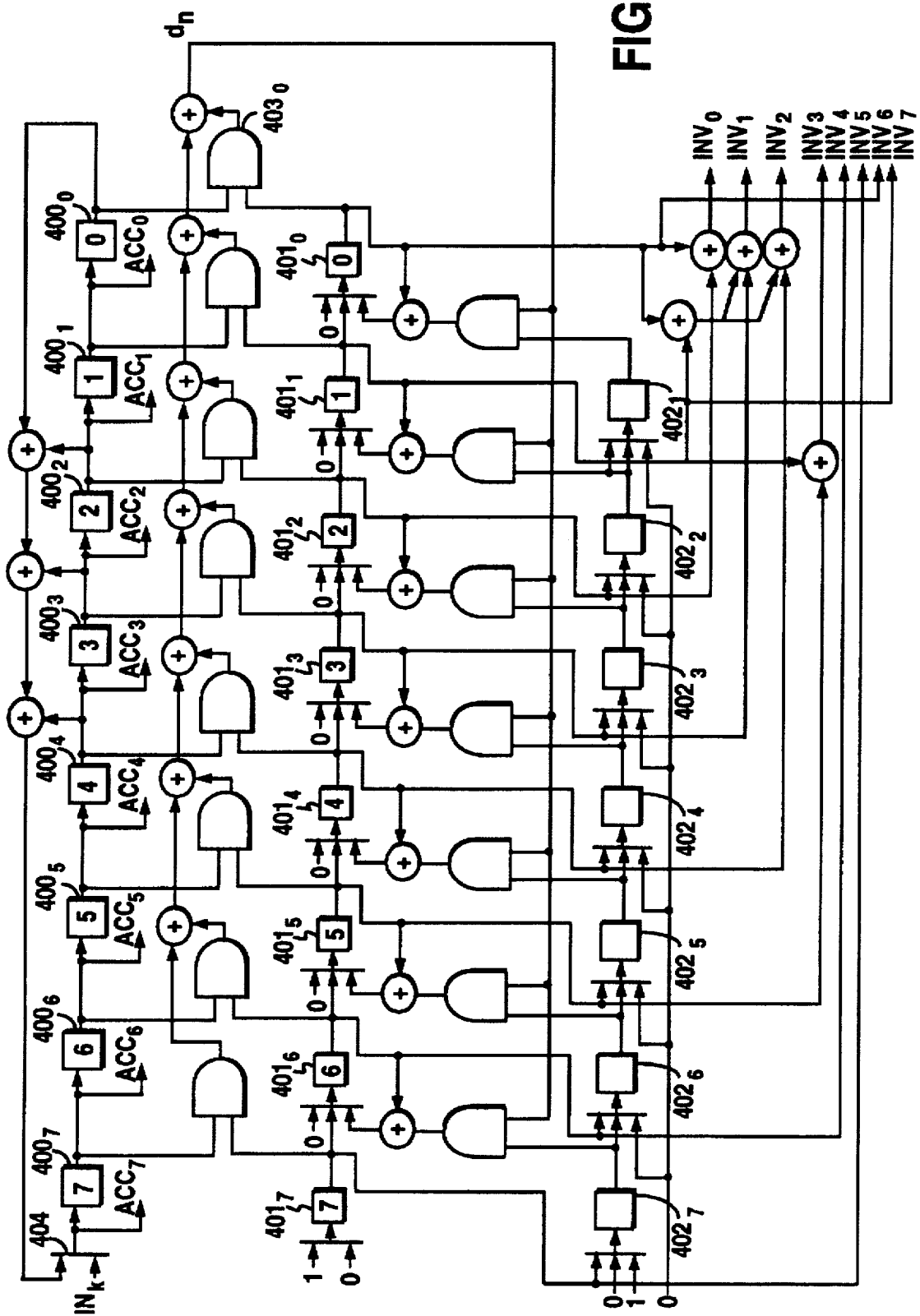
FIG. 9 is a schematic view of a circuit for calculating multiplicative inverses in $GF(2^8)$.
Figure 11:
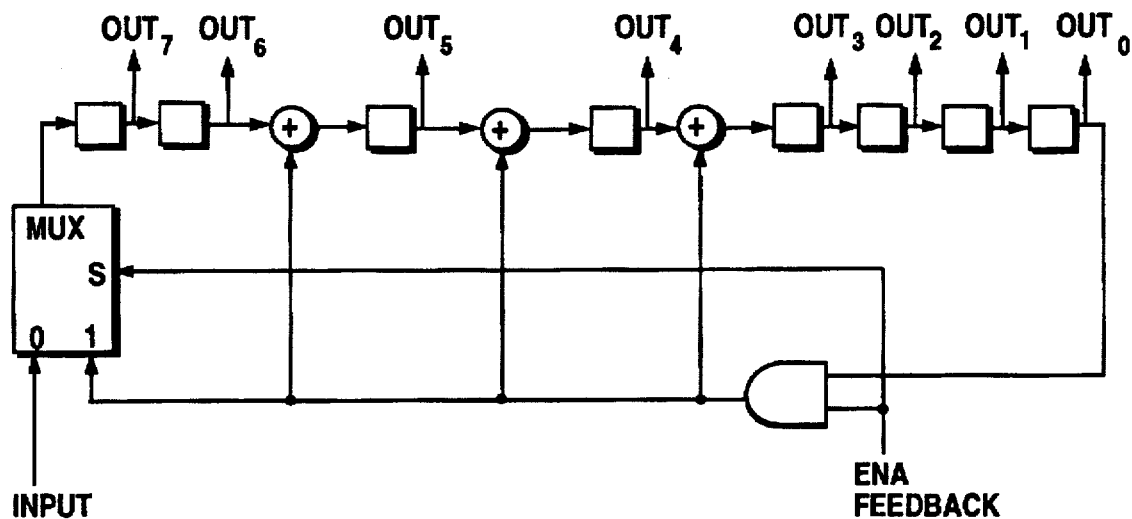
FIG. 11 is a schematic view of a modified-syndrome multiplication circuit according to an embodiment of the invention.

Output pins of error locator register 101 are connected both to a first port of inner product circuit 107 and to a first port of coefficient selecting-MUX 111. A second port of inner product circuit 107 is connected to modified-syndrome multiplication circuit 105. As shown in FIG. 9A, modified-syndrome multiplication circuit 105 includes a modified syndrome register 100 which receives a syndrome value from syndrome register 103 paired therewith. Modified syndrome register 100 has an α-multiple feedback circuit 120 connected thereto, such that the output of modified syndrome register 100 is an α-multiple of the syndrome value stored in register 103. FIG. 11 is a schematic diagram of details of modified-syndrome multiplication circuit 105 for the example field $GF(2^8)$.

During a first phase of each error locator iteration, inner product circuit 107 takes the inner product of the m-bit quantity $σ^{(n)}$ (from the error locator coefficient register 101) and the m-bit quantity which is α-multiple of the syndrome value stored in register 103 (from modified syndrome register 100) to produce a bit for application to adder 106. Adder 106 adds the resultant bit from inner product circuit 107 to a signal input (from an upstream slice) on line DNI to yield output signal DNO (for application to a downstream slice).

Coefficient selecting-MUX 111 has its second input port connected to an output port of the intermediate register 102. An output port of MUX 111 is connected to a first input port of inner product register 110. A second input port of inner product register is connected by line M to DM register 210 in the manner already described. An output port of inner product register 110 is connected both to a first input pin of AND gate 109 and to a first input of adder 112. An output port of adder 112 is connected to an input port of error locator register 101. A serial output port of error locator register 101 is connected both to a second input of adder 112 and by serial line SIG to root search and error/erasure magnitude generator 196 (see FIG. 7A). A second output port of intermediate register 102 is connected to a first input port of adder 108. A second input port of adder 108 is connected to an output port of AND gate 109. AND gate 109 has its first input port connected to the output port of inner product circuit 110 and its second input port connected by line CHANGE_L to controller 213 in the manner already described.

Slice 208A of FIG. 8B (errors and erasures mode) differs slightly from slices 207$_k$, as appears from a comparison of FIG. 8A (slices 207$_k$) and FIG. 8B (slice 208A). In particular, in slice 208A, MUX 111, adder 108, AND gate 109, and adder 112 are eliminated. The output port of error locator register 101 is connected only to coefficient output line SIG. The discrepancy-contributing inner product circuit 107 of slice 208A receives the value $\alpha^0$ at its first port and has its second port connected to modified-syndrome multiplication circuit 105. Inner product circuit 110 has its input port connected to the output port of the intermediate register 102. The output of inner product circuit 110 is connected only (and directly) to the input port of locator coefficient register 101. The output port of intermediate register 102 is connected to line TO.

Slice 208A of FIG. 8D (errors only mode) differs from slice 208A of FIG. 8B (errors and erasures mode) by elimination of locator coefficient register 101, intermediate coefficient register 102, and inner product circuit 110.

The structure of discrepancy inversion circuit 212 of FIGS. 7A and 7B is understood from the above referenced U.S. Pat. No. 5,467,297 entitled "FINITE FIELD INVERSION", which is incorporated herein by reference.

Figure 10:
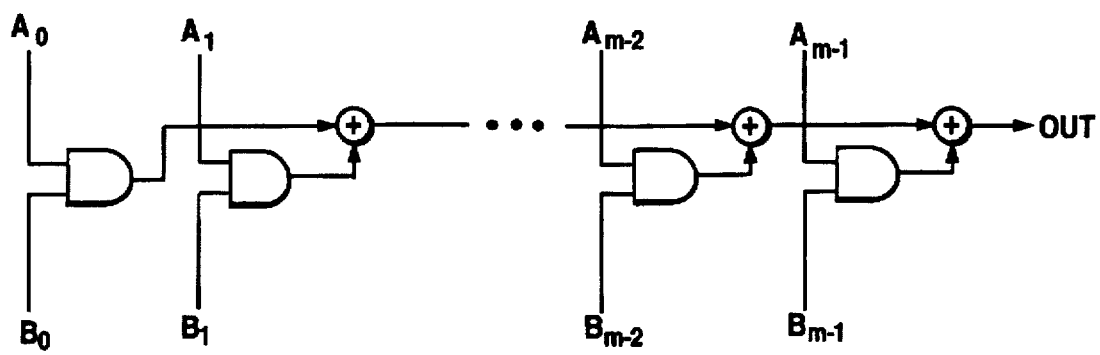
FIG. 10 is a schematic view of an inner product generator circuit.

FIG. 10 shows a schematic diagram of inner product generator circuit 107 of FIGS. 8A, 8B and 8D for one illustrative example of the invention. In the illustrative example of FIG. 10, it is assumed that the field is GF($2^8$) with field generator $x^8+x^4+x^3+x^2+1$. As taught in the above '297 U.S. patent, the β representation of an element is governed by the choice for $\alpha_0$. For the illustrative example it is assumed that $\alpha_0$ is $\alpha^{-4}$.

Decoder Operation: Overview

Figure 14:
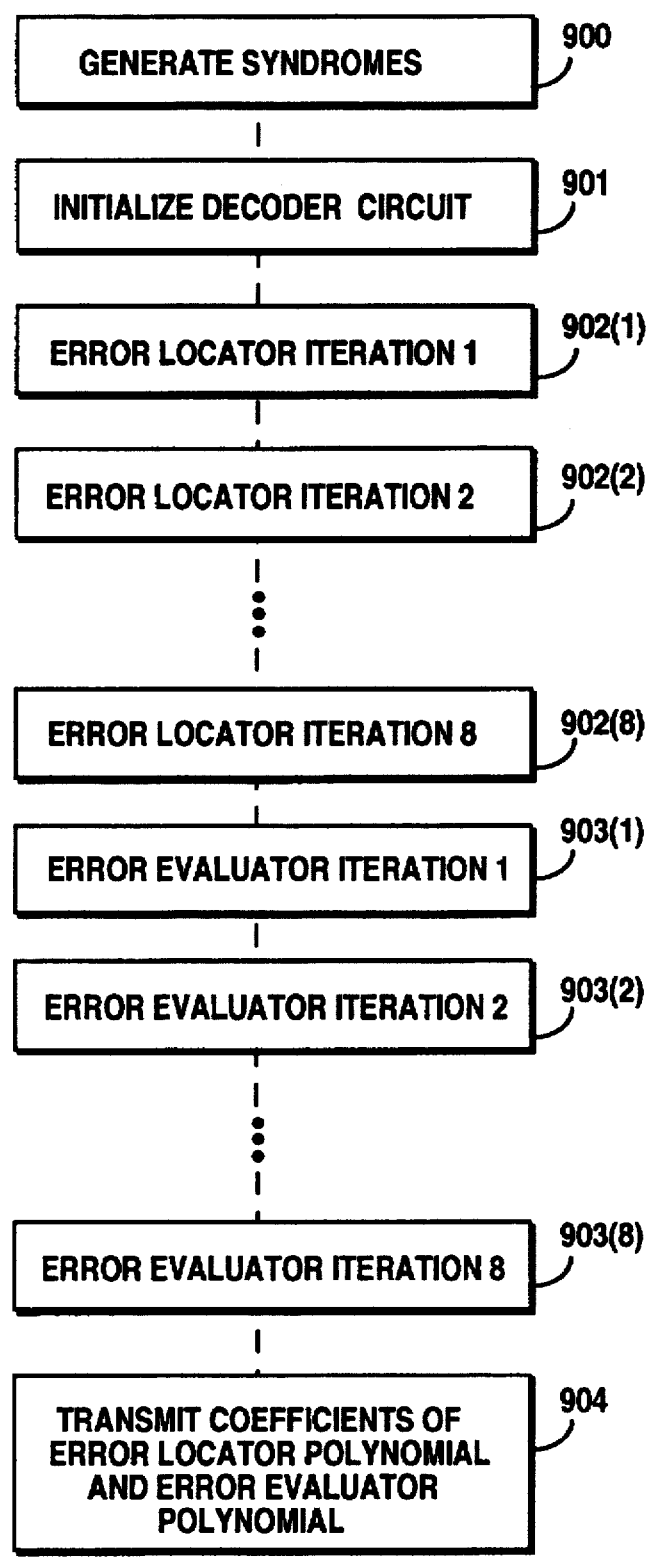
FIG. 14 is a flowchart showing general steps involved in error correction according to an embodiment of the invention.

FIG. 14 shows general steps involved in error correction of a codeword according to the present invention, beginning with generation of syndromes $S_0, S_1, \ldots S_7$ for a codeword at step 900 by syndrome generator 200 of FIG. 1. Step 901 involves initializing the decoder circuit 199. After initialization, decoding circuit performs a plurality of error locator iterations (steps 902(1) through 902(8)) followed by a plurality of error evaluator iterations (steps 903(1) through 903(8)). The number of iterations depends on the number of check symbols in the codeword and is illustrated as eight in the present embodiment. As discussed subsequently, TABLE 1 reflects operations occurring during error locator iteration 1 [step 902(1)]; TABLE 2 reflects operations occurring during error locator iteration 2 [step 902(2)]; and TABLE 3 reflects operations occurring during error locator iteration 8 [step 902(8)].

The error locator iterations determines coefficients of the error locator polynomial σ(x) which are then stored in the error locator registers 101 of FIGS. 8A and 8B. The error evaluator iterations obtain coefficients of the error evaluator polynomial ω(x) which are then stored in the intermediate registers (τ registers) 102 of FIGS. 8A and 8B. After obtaining the final values of the coefficients, at step 904 the coefficients of the error locator polynomial σ(x) [in the error locator registers 101] are serially transmitted on lines SIG, and the coefficients of the error evaluator polynomial ω(x) [in the intermediate registers (τ registers) 102] are serially transmitted on lines TO, to root search and error/erasure magnitude generator 196 of FIG. 1.

As will be explained further herein, each error locator iteration comprises two phases or stages: a first phase (also called phase A), and a second phase (also called phase B). During phase A of each error locator iteration, the current discrepancy $d_n$ is generated and the coefficient values in the intermediate registers (τ registers) 102 are updated. During phase B of each error locator iteration, the coefficient values in the error locator registers (σ registers) 101 are updated and, at the end of phase B, the inverse of the discrepancy $d_{n-1}$ is available (which becomes known as the inverse of the prior discrepancy or $d_{n-1}^{-1}$ during the next error locator iteration).

The error locator iterations of the present invention include an implementation of the Berlekamp-Massey algorithm based on the following recursion rules:

1) update τ:   $\tau^{(n)}(x) = x\tau^{(n-1)}(x)$ or $\tau^{(n)}(x) = x(\tau^{(n-1)}(x) + d_{n-1}^{-1}\sigma^{(n)}(x))$ calculate $d_n$:   $d_n = \Sigma\sigma_i S_{n-i}$ 2) update σ:   $\sigma^{(n+1)}(x) = \sigma^{(n)}(x) - d_n\tau^{(n)}(x)$ During the first m clocks (e.g., phase A) of an error locator iteration, the τ(x) for the previous iteration is calculated, i.e. $\tau^{(n)}$ (x) is calculated, not $\tau^{(n+1)}$ (x). According to the present invention, the coefficients of the polynomials τ(x) and σ(x) need not be updated at the same time since they do not depend on each other, i.e. $\sigma^{(n+1)}$ (x) depends on $\tau^{(n)}$ (x) and $\tau^{(n)}$ (x) depends on $\sigma^{(n)}$ (x), not $\sigma^{(n-1)}$ (x). Therefore τ(x) can be updated using σ(x) and then σ(x) can be updated using the already updated τ(x). The final update for τ(x) is never done (which is acceptable since τ(x) is only useful for updating σ(x) and, moreover, once the final update for σ(x) is done the final update for τ(x) is not needed).

The recursion equation for τ(x) can be written as:

$\tau^{(n+1)}(x) = x\tau^{(n)}(x)$ or $x\tau^{(n)}(x) + xd_n^{-1}\sigma^{(n+1)}(x)$.

To show that these equations are valid, the recursion equation for $\sigma^{(n+1)}$ (x) is substituted into the recursion equation for $\tau(x)^{(n+1)}$ to yield:

$\tau^{(n+1)}(x)$ = $x\tau^{(n)}(x)$ or $x\tau^{(n)}(x) + xd_n^{-1}(\sigma^{(n)}(x) - d_n\tau^{(n)}(x))$ =

$x\tau^{(n)}(x)$ or $xd_n^{-1}\sigma^{(n)}(x)$ which is identical to EQUATIONS 1.

During the first m clocks of an error locator iteration, the inverse of the discrepancy of the previous iteration (i.e., $d_{n-1}^{-1}$) is used. In accordance with an advantage of the present invention, a sequential method may be used for obtaining $d_{n-1}^{-1}$ instead of the usual $2^m \times m$ ROM. This sequential method is implemented by the discrepancy inversion circuit 212 of FIGS. 7A and 7B, which is more fully described in U.S. Pat. No. 5,467,297 entitled "FINITE FIELD INVERSION" incorporated herein by reference.

In the update equation for $\tau^{(n)}(x)$, the first choice is taken when the order of $\sigma(x)$ is not changed and the second choice is taken when the order of $\sigma(x)$ is changed. If the signal CHANGE_L is used to indicate those iterations during which the order of $\sigma(x)$ is changed, then the recursion equations can be written according to EQUATIONS 3.

EQUATIONS 3:
1) update $\tau$:  $\tau^{(n)}(x) = x(\tau^{(n-1)}(x) + d_{n-1}^{-1}\sigma(x)*CHANGE\_L)$ calculate $d_n$: $d_n = \sum_{k=0}^{t-1} \sigma_k^{(n)} S_{n-k}$ 2) update $\sigma$: $\sigma^{(n+1)}(x) = \sigma^{(n)}(x) - d_n\tau^{(n)}(x)$

Decoder Operation: Syndrome Generation

The syndrome generation step 900 of FIG. 14 is conventional and understood by those skilled in the art. Assume the Reed-Solomon codeword generator polynomial is:

$$G(x) = \prod_{k=0}^{t-1} (x + \alpha^{L+k})$$

Then a data sequence D(x) is coded into a codeword C(x) in the following way: $C(x) = D(x)x^t - (D(x)x^t) \bmod G(x)$. When a possibly corrupted codeword, $R(x) = C(x) + E(x)$, is received it is stored in buffer 194 and sent to the syndrome generator 200. At some later point, as determined by the asynchronous control of buffer 194, a byte-to-be corrected in the codeword R(x) is sent to register 195 in FIG. 1. The syndromes are calculated as:

$$S_k = R(x) \bmod (x + \alpha^{L+k})$$

for
k=0, 1, . . . , t-1.

Decoder Operation: Initialization

In initialization step 901 (see FIG. 14), syndrome values $S_0, S_1, \ldots S_7$ are loaded into the syndrome registers 103. In addition, the error locator registers 101, intermediate registers 102, and other values are initialized.

In the loading of syndrome values, syndrome $S_k$ is shifted into slice $207_{t-k}$ for k=1,2, . . . , t-1 and $S_0$ is shifted into slice 208A. Within each slice, shown in FIG. 8A for example, a syndrome is shifted into the S register 103 via MUX 104. Thus, initially syndrome $S_0$ is loaded into syndrome register 103 of slice 208A, while syndrome values $S_1$, $S_2, \ldots S_7$ are loaded into syndrome registers of slices $207_7$, $207_6$, . . . $207_1$, respectively. The syndrome values are serially loaded (one bit at a time) from syndrome generator 200 into the respective registers 103.

After the syndromes are initially shifted into the S registers 103, a forward shift of the syndromes is then performed wherein the contents of each S register 103 is serially shifted out (from the SFO output of each slice) to the SFI input of the next slice, and gated into the S register 103 of the next slice via MUX 104. In this initialization shift, the output of slice t (block 208A) feeds the input of slice $207_1$, thereby forming a circular shift. During this circular shifting, the output of the S register 103 of each slice is also shifted into its paired SM register 100.

Error locator registers 101 and intermediate registers 102 of slice 208A slices $207_1, 207_2, \ldots 207_7$ are reset to zero (by timer/controller 198) before the first phase of the first error locator iteration for the codeword.

Controller 213 (see FIG. 7A, for example) outputs the CHANGE_L signal to the CHG inputs of each slice. The CHANGE_L signal is initialized to "1" before starting the first iteration. The controller 213 also maintains two variables, LN and LM, which are initialized to 0 and 1 respectively. Also the DM register 210 is initialized to the alpha basis representation of $\alpha^0$ via MUX 211, which is the initial value for $d_{n-1}^{-1}$.

Decoder Operation: Discrepancy Generation

This brief discussion of generation of the current discrepancy $d_n$ is a prelude to a discussion of actual error locator iterations. Using the expression for $d_n$ from EQUATION 3

$$d_n = \sum_{k=0}^{t-1} \sigma_k^{(n)} S_{n-k}$$

it is seen that the discrepancy $d_n$ is derived from values in the locator coefficient registers 101 (i.e., the $\sigma$ registers) and the syndromes. Whereas the values stored in the locator coefficient registers 101 are in beta or second basis representation, the syndrome values are in the alpha or first basis representation. Accordingly, in order to multiply these two values together, one of the values must be repetitively multiplied by $\alpha$. In the illustrated embodiment, the syndromes are multiplied by $\alpha$ using the modified-syndrome multiplication circuit 105 as afore described.

The multiplication which yields the current discrepancy is partially accomplished using inner product circuit 107 (shown in more detail for one example field in FIG. 10). Inner product circuit 107 comprises part of a multiplier which forms part of a larger inner product (a term of the current discrepancy $d_n$). In particular, inner product circuit 107 (together with $\sigma$ register 101 and the modified-syndrome multiplication circuit 105) comprises a multiplier structure that produces, for each clock pulse, a serial output which is applied to adder 106.

Adder 106 sums the serial outputs of comparable multipliers of other slices to obtain an inner product of the syndromes with the current coefficients of the error locator polynomial. Thus, it should be understood that all slices are simultaneously conducting a multiplication and producing a one-bit output per clock cycle, which one-bit output is added (by adders 106) to the output of other slices to obtain a bit of the current discrepancy. Moreover, during the clock cycle in which a bit of the discrepancy $d_n$ is generated, that bit is transmitted to the discrepancy inversion circuit 212.

Decoder Operation: Error Locator Iteration, (PHASE A)

The operation of decoder circuit 199 during the error locator iterations is understood with respect to TABLE 1, TABLE 2, and TABLE 3. The TABLES reflect operations during error locator iterations 1, 2, and 8, respectively (see steps 902(1), 902(2), and 902(8), respectively). As mentioned before, each error locator iteration includes both a first phase (also known as phase A) and a second phase (also known as phase B).

During the first error locator iteration for each codeword, all slices $207_1$-$207_7$ and 208A have zero initialized in the error locator registers (i.e., $\sigma$ registers) 101. Accordingly, slices $207_1$-$207_7$ contribute nothing to the discrepancy sum taking place during phase A of the first iteration. However, during the first error locator iteration, slice 208A (which has been initialized with syndrome $S_0$ and with $\alpha^0$ as the other input to inner product circuit 107) will produce a non-zero output (basically, $S_0\alpha^0=S_0$). Thus, during the first clock of phase A, inner product circuit 107 of slices 207 put out a bit of zero as their product. These bit zeros are added together by adders 106 to the non-zero output of slice 208A, which sum is bit 0 of the current discrepancy $d_n$. The thusly-obtained bit 0 of the current discrepancy $d_n$ is shifted during the same clock cycle to discrepancy inversion circuit 212 (see FIG. 9), which immediately begins its inversion.

During each clock cycle of the first error locator iteration, a further bit of the first term of the current discrepancy is obtained (from slice 208A exclusively during the first iteration) and applied to discrepancy inversion circuit 212.

During phase A of the first iteration, the intermediate registers (i.e., $\tau$ registers) 102 have all been initialized to zero. During the first iteration, $\tau_0$ (register 102 in slice $207_1$) is initialized to $\alpha^0$ by virtue of the fact that DM register 210 has been initialized to $\alpha^0$ and CHANGE_L has been initialized to 1.

During error locator iterations other than the first iteration for a codeword, the values in the intermediate registers ($\tau$ registers) 102 are updated. The manner in which the update of $\tau$ registers 102 is updated depends on the result of the previous iteration (e.g. whether there was a length change as indicated by signal CHANGE_L).

Basically, in order to update the values in the intermediate registers ($\tau$ registers) 102 during phase A, decoder circuit 199 multiplies values in the error locator registers 101 (e.g., $\sigma$ registers ) by $d_{n-1}^{-1}$. This implements EQUATIONS 3, which state in part $$\tau^{(n)}(x)=x(\tau^{(n-1)}(x)+d_{n-1}^{-1}\sigma(x)\cdot CHANGE\_L)$$

The quantity $d_{n-1}^{-1}$ is initialized to $\alpha^0$ in the DM register 210 for the first iteration, and thereafter is generated by discrepancy inversion circuit 212 and loaded into DM register 210 via MUX 211.

More specifically describing the update of the intermediate register 102, during phase A the contents of the error locator register 101 is transmitted via MUX 111 to a first port of inner product circuit 110. The second input port of inner product register is connected by line M to DM register 210 to receive an $\alpha$-multiple of $d_{n-1}^{-1}$. The output of inner product circuit 110 is applied to AND gate 109 and (if required by signal CHANGE_L) is added (by adder 108) to the contents of the intermediate register 102 (i.e., $\tau$ register) for application on line TO to the $\tau$ register 102 of the rightwardly neighboring slice. If signal CHANGE_L does not require, the contents of the intermediate register 102 (i.e., $\tau$ register) are directly applied on line TO to the $\tau$ register 102 of the rightwardly neighboring slice without addition of the output of inner product circuit 110. Thus, it requires all clocks of phase A in order to update the intermediate registers 102 (i.e., $\tau$ register) of all slices.

The values in the error locator registers (e.g., $\sigma$ registers) 101 do not change during the first phase of an error locator iteration. However, the value in register SM 100 (initially loaded with the syndrome) is being clocked with $\alpha$ feedback during each clock cycle. The original syndrome value remains in register 103 during the first phase of each iteration.

At the end of phase A, all 8 bits of the current discrepancy have been shifted (in second or beta basis representation) into discrepancy inversion circuit 212; have been converted into first or $\alpha$ basis representation (by conversion circuit 214); and, have been muxed into DM register 210 for use during phase B. However, at the end of phase A, discrepancy inversion circuit 212 still needs another eight clock cycles (e.g., the duration of phase B) in order to generate the inverse of $d_n$.

Phase A execution of decoding circuit 199 differs from iteration to iteration primarily by the fact that registers 103 (and hence registers 100) and $\alpha$ registers 101 have been loaded/updated with different values. As explained below, during phase B syndrome values are circularly shifted and $\alpha$ register values are updated. Hence, during a second error locator iteration for a codeword, two slices (e.g., slices 208A and slice $207_1$) will be operative in yielding current discrepancy $d_n$. Similarly, with respect to discrepancy generation, three slices will be operative during a third iteration, four slices during a forth iteration, and so on until all slices are operative during the eight (last) error locator iteration. At the end of each phase A execution, decoder circuit 199 has generated $d_n$; has shifted dn into discrepancy inversion circuit 212; and, has updated intermediate registers 102 (i.e., $\tau$ register) of all slices.

Decoder Operation: Error locator Iteration, Phase B

Phase B also has, in the illustrated embodiment, eight clock cycles. Three major actions occur during phase B: the syndromes are serially shifted to an adjacent slice; generation of the inverse of $d_n$ (which will be known as $d_{n-1}^{-1}$ during the next error locator iteration) is completed; and, values in the error locator registers ($\sigma$ registers 101) are updated using the values in the intermediate registers 102 and the value of $d_n$ which was just generated during phase A.

During phase B of each error locator iteration, decoder circuit 199 serially shifts the syndrome values in preparation for the next phase A so that a new $d_n$ can be generated during the next phase A. In this respect, a forward shift of the syndromes is performed wherein the contents of each S register 103 is shifted out the slice SFO output to the SFI input of the next slice and into the S register 103 of the next slice (via MUX 104). The output of slice 208A feeds the input of slice $207_1$ forming a circular shift. During this shifting, the transmitting slice also shifts the outgoing syndrome value into its SM register 100.

At the beginning of phase B, DM register 210 contains not $d_{n-1}^{-1}$, but $d_n$ of the current iteration (which was just determined during phase A). The value dn in DM register 210 has been converted (by conversion circuit 214) to alpha representation, which is necessary for conducting an inner product operation with respect to the contents of the intermediate registers 102 ($\tau$ registers) which are in $\beta$ basis representation. After the first clock cycle of phase B, the value of $d_n$ is multiplied by $\alpha$ so that the contents of DM register becomes an $\alpha$-multiple of $d_n$ for use in phase B.

During phase A, the intermediate registers 102 (i.e., $\tau$ registers) were updated by shifted values while the error locator registers (e.g., $\sigma$ registers) 101 stayed fixed. During phase B, on the other hand, the error locator registers (e.g., $\sigma$ registers) 101 are updated while the intermediate registers 102 (i.e., $\tau$ registers) remain fixed. In fact, it is the intermediate registers 102 (i.e., $\tau$ registers) that are used to update the values of the coefficients of the error locator polynomial stored in the error locator registers 102.

During phase B, the coefficients of the error locator polynomial are updated according to EQUATIONS 3

$$\sigma^{(n+1)}(x)=\sigma^{(n)}(x)-d_n\tau^{(n)}(x)$$

The contents of the intermediate registers 102 (i.e., $\tau$ registers) are applied through MUX 111 to the first input port of inner product circuit 110. Inner product circuit 110 forms an inner product with the contents of the τ register and $d_n$ (dn having been applied on line M). The output of inner product circuit 110 is a serial bit (one bit per clock of phase B), which is added by single bit adder 112 to the serially shifted-out contents of error locator register (e.g., σ register) 101. Thus, it takes eight clock cycles to update the contents of the error locator register (e.g., σ register) 101 for each slice. The updating operation just-described for error locator register (e.g., σ register) 101 of one slice simultaneously occurs for all slices (there being, of course, differing values in the σ registers 101 of differing slices).

Thus, when phase A of the next error locator iteration begins, the phase A operations will be executed with the new values in the σ registers 101 as updated during the previous phase B. Also, at the end of phase B, discrepancy inversion circuit 212 has completed the inversion of $d_n$, which is available at the INV outputs and applied via MUX 211 into DM register 210 for use as $d_{n-1}^{-1}$ during phase A of the next error locator iteration.

At the end of phase B of the last (eighth) error locator iteration, the final values of the coefficients of the error locator polynomial for the codeword are stored in the σ registers 101.

Decoder Operation: Error Evaluator Iteration

After completion of the last error locator iteration for a codeword (e.g., after step 902(8) of FIG. 14, the final values of the coefficients of the error locator polynomial for the codeword are stored in the σ registers 101. Yet remaining is the generation of coefficients for the error evaluator polynomial. Advantageously, using another eight iterations (distinctly known as error evaluator iterations) as depicted by steps 903(1)–903(8) of FIG. 14, decoder circuit 199 generates the error evaluator coefficients and stores those coefficients in the intermediate registers 102 (τ registers).

The final values of the coefficients of the error locator polynomial for the codeword are used to generate the error evaluator polynomial ω(x). The coefficients of the error evaluator polynomial ω(x) are defined as:

$$\omega_k = \sum_{j=0}^{k} \sigma_j S_{k-j}$$

for k=0,1, ..., t−1. Because the form of the error evaluator polynomial ω(x) is the same as that for calculating $d_n$, the decoding circuit 199 can find coefficients for both polynomials. The coefficients are generated in t double phase iterations (assuming t errors to correct).

The error evaluator iterations are similar to phase A of the error locator iterations with the following modifications:

(1) During phase A of the last error locator algorithm iteration (e.g., step 902(8) of FIG. 14), the syndrome registers 103 in each slice are backward shifted, i.e. the contents of the S registers 103 are shifted out SBO output and into the SBI input of the preceding slice and into the S register 103 of the previous slice via MUX 104 A signal G from controller 213 is set to "1" during this backward shift of syndromes.

(2) During phase B of the last error locator iteration (e.g., step 902(8) of FIG. 14), the S registers 103 in each slice are again backward shifted and at the same time the output of the S register 103 in each slice is shifted into the SM register 100. During this and all subsequent backward shifts the signal G output from controller 213 is set to "0". Setting signal G in this manner forces "0"s into the SBI input of slice t−1 by AND gate 216.

(3) During phase A of each error evaluator iteration (also known as an iteration), the DNO output of slice t is $\omega_k$ where k is t−1 for the first ω iteration, t−2 for the second, etc., and 0 for the last ω iteration, $\omega_k$ is shifted into the TI input of slice 1 via MUX 215.

(4) During phase B of each ω iteration, the S registers 104 are backward shifted and also shifted into the SM registers 100. The σ registers 101 do not shift.

(5) The value of CHANGE_L is fixed at "0" as shown in FIG. 12. This allows all of the τ registers to function as a single shift register so that after the t iterations the τ register in slice k contains $\omega_{k-1}$.

For example, after completion of the 8 clocks of a first error evaluator iteration, the eight bits of $\omega_7$ are loaded into τ register 102 of slice $207_1$. After completion of a second error evaluator iteration, the eight bits of $\omega_6$ are loaded into τ register 102 of slice $207_1$ and $\omega_7$ is transferred into τ register 102 of slice $207_2$. Similar processing continues for all eight error evaluator iterations until all coefficients $\omega_0$–$\omega_7$ are stored in slices $207_1$–208A, respectively.

During the error evaluator iterations, the previously-determined final σ coefficients remain undisturbed in σ registers 101.

After the t iterations the σ and t registers are then shifted m more times so that the error locator and error evaluator polynomials can be transferred to root search and error/erasure magnitude generator 196 (see FIG. 1).

Decoder Operation: Coefficient Transfer

After completion of all error locator iterations and all error evaluator iterations, and as reflected by step 904 of FIG. 14, decoder circuit 199 transfers the final values for the coefficients of the error locator polynomial (stored in the σ registers 101) and the final values for the coefficients of the error evaluator polynomial (stored in the τ registers 102) to root search and error/erasure magnitude generator 196. Each slice of decoder circuit 199 has one σ coefficient in its σ register 101 and one ω coefficient in its τ register 102. Transfer from the σ register 101 and the τ register 102 occur (on lines SIG and TO, respectively) at a rate of one bit per clock (serial transfer), with serial transfers from both registers 101 and 102 occurring simultaneously. Thus, root search and error/erasure magnitude generator 196 receives simultaneously one bit of a σ coefficient from each slice and one bit of an ω coefficient from each slice.

Root search and error/erasure magnitude generator 196 supplies error patterns to adder 202 to correct data as it is retrieved from register 195. Error locations are found with a root search for σ(x), i.e. byte k is in error whenever σ($\alpha^{-k}$)=0. The error magnitude is then calculated as:

$$E_k = \frac{\alpha^{-k(L-1)}\omega(\alpha^{-k})}{\sigma'(\alpha^{-k})}$$

where ' represents the first derivative of σ.

Decoder Operation: Erasures

Erasure pointers decrease the complexity of the Reed-Solomon decoder by decreasing the redundancy needed to correct t errors. Without erasure pointers, the Reed-Solomon decoder requires 2 t redundancy symbols to correct t data symbols. For every correct erasure pointer, however, the number of necessary redundancy symbols decreases by one.

If the received sequence R(x) contains v erasures, then the erasure pointers are input during the first v error locator iterations which are modified in the following way:

(1) At the end of each phase A of the first v iterations, instead of loading $d_n$ into DM register 210, an erasure value in the form of $\alpha$ raised to the $e_k$ power is loaded into DM register 210 via MUX 211 (see FIG. 7A). In this nomenclature, $e_k$ is the location of the $k^{th}$ erasure, i.e., the $e_k^{th}$ coefficient of R(x).

(2) At the end of each phase B of the first v iterations, instead of loading $d_{n-1}$ into DM 210, $\alpha^0$ is loaded into DM register 210 via MUX 211.

(3) The signal CHANGE_L is fixed at "1" and at the end of each phase A, LN gets LM and LM gets LM+1. This is illustrated in FIG. 12.

Slice t, detailed in FIG. 8B, does not contain adder 112, since the only time that $\sigma_t$ is generated is when there are t erasures and no errors (in which case all iterations will be erasure iterations and the only time that the $\sigma$ register in slice t will receive a non-zero value will be on the last iteration).

Figure 15:
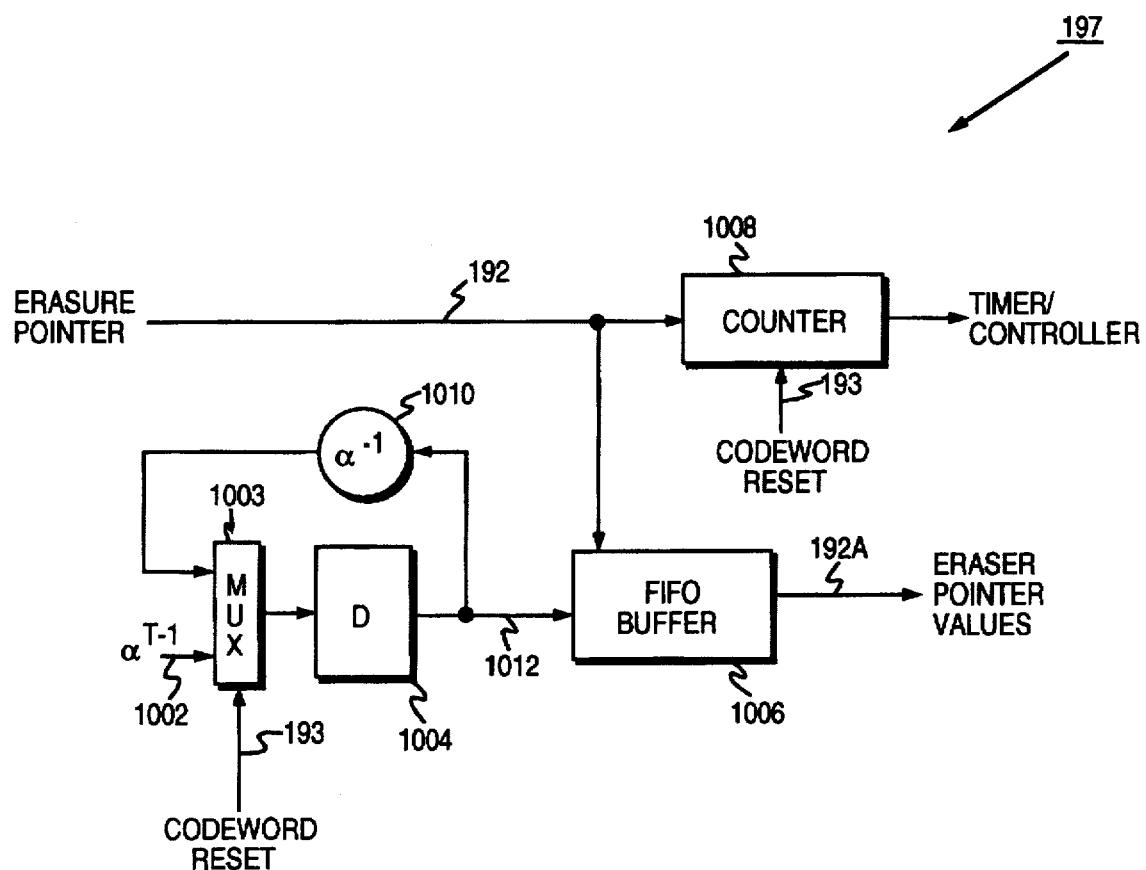
FIG. 15 shows details of the erasure pointer value generator.

FIG. 15 illustrates a circuit for generating the erasure values $\alpha$ raised to the $e_k$ power. At the beginning of a new codeword detected by the read channel, the Codeword Reset line 193 selects $\alpha^{T-1}$ 1002 as the output of multiplexor 1003 and loads it into a register 1004, where T is the number of symbols in a codeword. The Codeword Reset line 193 also resets a counter 1008 which counts the number of erasure pointers input over line 192 for the new codeword. At each clock, if an erasure pointer is input over line 192, it loads the corresponding error value (i.e., $\alpha$ raised to the $e_k$ power) into a FIFO buffer 1006 over line 1012 and increments counter 1008. Also at each clock, the output of the register 1004 is multiplied by $\alpha^{-1}$ 1010 and the product is restored to the register 1004 through multiplexor 1003. In this manner, the output of the register 1004 corresponds to the error value (i.e., $\alpha$ raised to the $e_k$ power) for the current erasure pointer location in the codeword.

When the decoder 199 of FIG. 1 is ready to start processing the syndromes of the new codeword, the number of erasure pointers generated for that codeword are transferred from counter 1008 to the Timer/Controller 198. Then, during the first v iterations (where v is the number of erasure pointers), the Timer/Controller 198 loads the erasure pointers from the FIFO buffer 1006 into the decoder 199, and the first v error locator iterations are executed according to the steps outlined above.

Decoder Operation: Errors Only Decoding

FIG. 7B shows an error correction system of the invention which (unlike the system of FIG. 7A) does not incorporate erasure correction. Since at most t/2 errors may be corrected, only t/2 Berlekamp-Massey algorithm slices are needed. Thus, in the embodiment of FIG. 7B slices (t/2)+1 to t−1 are replaced with the collective modified slice circuit 217, detailed in FIG. 8C. The slices of circuit 217 contain only an S register 103 and associated MUX 104. Slice t of the system of FIG. 7B is replaced with a modified slice 208B which is detailed in FIG. 8D. Slice 208B of FIG. 8D which contains only S register 103 (with associated MUX 104); modified-syndrome multiplication circuit 105; and inner product circuit 107. During initialization of the system of FIG. 7B, the S register 103 in slice k is loaded with $S_{t-k}$, as before, with k=1,2,..., t/2. $S_0$ is loaded into slice 208B, as before, and the remaining syndromes are loaded into the S registers 103 contained in circuit 217. There are t iterations for generating $\sigma(x)$ and then t/2 iterations for generating $\omega(x)$. The $\omega(x)$ calculated by this system has coefficients:

$$\omega_k = \sum_{j=0}^{k} \sigma_j S_{k-j+\frac{t}{2}}$$

for k=0, 1, ..., t/2−1.

The t/2 coefficients of $\sigma(x)$ and the t/2 coefficients of $\omega(x)$ are then transferred into root search and error/erasure magnitude generator 196 to correct errors. A root search is performed as before and then the error magnitude is then calculated as:

$$E_k = \frac{\alpha^{-k(L-1+\frac{t}{2})} \omega(\alpha^{-k})}{\sigma'(\alpha^{-k})}$$

The objects of the invention have been fully realized through the embodiments disclosed herein. Those skilled in the art will appreciate that the aspects of the invention can be achieved through various other embodiments without departing from the spirit and scope of the invention. The particular embodiments disclosed are illustrative and not meant to limit the scope of the invention as appropriately construed by the following claims.

TABLE 1

| ERROR LOCATOR ITERATION 1 | | | |
|---|---|---|---|
| Iteration: 1 | Phase: A | Clock: 1 | obtain bit 0 of $S_0\sigma_0$ initialize $\tau_0$ |
| Iteration: 1 | Phase: A | Clock: 2 | obtain bit 1 of $S_0\sigma_0$ initialize $\tau_0$ |
| Iteration: 1 | Phase: A | Clock: 3 | obtain bit 2 of $S_0\sigma_0$ initialize $\tau_0$ |
| Iteration: 1 | Phase: A | Clock: 4 | obtain bit 3 of $S_0\sigma_0$ initialize $\tau_0$ |
| Iteration: 1 | Phase: A | Clock: 5 | obtain bit 4 of $S_0\sigma_0$ initialize $\tau_0$ |
| Iteration: 1 | Phase: A | Clock: 6 | obtain bit 5 of $S_0\sigma_0$ initialize $\tau_0$ |
| Iteration: 1 | Phase: A | Clock: 7 | obtain bit 6 of $S_0\sigma_0$ initialize $\tau_0$ |
| Iteration: 1 | Phase: A | Clock: 8 | obtain bit 7 of $S_0\sigma_0$ initialize $\tau_0$ $d_n$ available |
| Iteration: 1 | Phase: B | Clock: 1 | update bit 0 of $\sigma_1$ shift syndromes forward one bit |
| Iteration: 1 | Phase: B | Clock: 2 | update bit 1 of $\sigma_1$ shift syndromes forward one bit |
| Iteration: 1 | Phase: B | Clock: 3 | update bit 2 of $\sigma_1$ shift syndromes forward one bit |
| Iteration: 1 | Phase: B | Clock: 4 | update bit 3 of $\sigma_1$ shift syndromes forward one bit |
| Iteration: 1 | Phase: B | Clock: 5 | update bit 4 of $\sigma_1$ shift syndromes forward one bit |
| Iteration: 1 | Phase: B | Clock: 6 | update bit 5 of $\sigma_1$ shift syndromes forward one bit |
| Iteration: 1 | Phase: B | Clock: 7 | update bit 6 of $\sigma_1$ shift syndromes forward one bit |
| Iteration: 1 | Phase: B | Clock: 8 | update bit 7 of $\sigma_1$ shift syndromes forward one bit $d_{n-1}^{-1}$ available |

TABLE 2

| ERROR LOCATOR ITERATION 2 | | | |
|---|---|---|---|
| Iteration: 2 | Phase: A | Clock: 1 | obtain bit 0 of $S_0\sigma_1 + S_1\sigma_0$ update $\tau$ |
| Iteration: 2 | Phase: A | Clock: 2 | obtain bit 1 of $S_0\sigma_1 + S_1\sigma_0$ update $\tau$ |
| Iteration: 2 | Phase: A | Clock: 3 | obtain bit 2 of $S_0\sigma_1 + S_1\sigma_0$ update $\tau$ |

TABLE 2-continued

ERROR LOCATOR ITERATION 2

| | | | |
|---|---|---|---|
| Iteration: 2 | Phase: A | Clock: 4 | obtain bit 3 of $S_0\sigma_1 + S_1\sigma_0$ update $\tau$ |
| Iteration: 2 | Phase: A | Clock: 5 | obtain bit 4 of $S_0\sigma_1 + S_1\sigma_0$ update $\tau$ |
| Iteration: 2 | Phase: A | Clock: 6 | obtain bit 5 of $S_0\sigma_1 + S_1\sigma_0$ update $\tau$ |
| Iteration: 2 | Phase: A | Clock: 7 | obtain bit 6 of $S_0\sigma_1 + S_1\sigma_0$ update $\tau$ |
| Iteration: 2 | Phase: A | Clock: 8 | obtain bit 7 of $S_0\sigma_1 + S_1\sigma_0$ update $\tau$ $d_n$ available |
| Iteration: 2 | Phase: B | Clock: 1 | update bit 0 of $\sigma_1$ and $\sigma_2$ shift syndromes forward one bit |
| Iteration: 2 | Phase: B | Clock: 2 | update bit 1 of $\sigma_1$ and $\sigma_2$ shift syndromes forward one bit |
| Iteration: 2 | Phase: B | Clock: 3 | update bit 2 of $\sigma_1$ and $\sigma_2$ shift syndromes forward one bit |
| Iteration: 2 | Phase: B | Clock: 4 | update bit 3 of $\sigma_1$ and $\sigma_2$ shift syndromes forward one bit |
| Iteration: 2 | Phase: B | Clock: 5 | update bit 4 of $\sigma_1$ and $\sigma_2$ shift syndromes forward one bit |
| Iteration: 2 | Phase: B | Clock: 6 | update bit 5 of $\sigma_1$ and $\sigma_2$ shift syndromes forward one bit |
| Iteration: 2 | Phase: B | Clock: 7 | update bit 6 of $\sigma_1$ and $\sigma_2$ shift syndromes forward one bit |
| Iteration: 2 | Phase: B | Clock: 8 | update bit 7 of $\sigma_1$ and $\sigma_2$ shift syndromes forward one bit $d_{n-1}^{-1}$ available |

TABLE 3

ERROR LOCATOR ITERATION 8

| | | | |
|---|---|---|---|
| Iteration: 8 | Phase: A | Clock: 1 | obtain bit 0 of $S_0\sigma_7 + S_1\sigma_6 \ldots + S_7\sigma_0$ update $\tau$, shift syndromes backward |
| Iteration: 8 | Phase: A | Clock: 2 | obtain bit 1 of $S_0\sigma_7 + S_1\sigma_6 \ldots + S_7\sigma_0$ update $\tau$, shift syndromes backward |
| Iteration: 8 | Phase: A | Clock: 3 | obtain bit 2 of $S_0\sigma_7 + S_1\sigma_6 \ldots + S_7\sigma_0$ update $\tau$, shift syndromes backward |
| Iteration: 8 | Phase: A | Clock: 4 | obtain bit 3 of $S_0\sigma_7 + S_1\sigma_6 \ldots + S_7\sigma_0$ update $\tau$, shift syndromes backward |
| Iteration: 8 | Phase: A | Clock: 5 | obtain bit 4 of $S_0\sigma_7 + S_1\sigma_6 \ldots + S_7\sigma_0$ update $\tau$, shift syndromes backward |
| Iteration: 8 | Phase: A | Clock: 6 | obtain bit 5 of $S_0\sigma_7 + S_1\sigma_6 \ldots + S_7\sigma_0$ update $\tau$, shift syndromes backward |
| Iteration: 8 | Phase: A | Clock: 7 | obtain bit 6 of $S_0\sigma_7 + S_1\sigma_6 \ldots + S_7\sigma_0$ update $\tau$, shift syndromes backward |
| Iteration: 8 | Phase: A | Clock: 8 | obtain bit 7 of $S_0\sigma_7 + S_1\sigma_6 \ldots + S_7\sigma_0$ update $\tau$, shift syndromes backward $d_n$ available |
| Iteration: 8 | Phase: B | Clock: 1 | update bit 0 of $\sigma_1, \sigma_2 \ldots \sigma_8$ shift syndromes backward one bit |
| Iteration: 8 | Phase: B | Clock: 2 | update bit 1 of $\sigma_1, \sigma_2 \ldots \sigma_8$ shift syndromes backward one bit |
| Iteration: 8 | Phase: B | Clock: 3 | update bit 2 of $\sigma_1, \sigma_2 \ldots \sigma_8$ shift syndromes backward one bit |
| Iteration: 8 | Phase: B | Clock: 4 | update bit 3 of $\sigma_1, \sigma_2 \ldots \sigma_8$ shift syndromes backward one bit |
| Iteration: 8 | Phase: B | Clock: 5 | update bit 4 of $\sigma_1, \sigma_2 \ldots \sigma_8$ shift syndromes backward one bit |
| Iteration: 8 | Phase: B | Clock: 6 | update bit 5 of $\sigma_1, \sigma_2 \ldots \sigma_8$ shift syndromes backward one bit |
| Iteration: 8 | Phase: B | Clock: 7 | update bit 6 of $\sigma_1, \sigma_2 \ldots \sigma_8$ shift syndromes backward one bit |
| Iteration: 8 | Phase: B | Clock: 8 | update bit 7 of $\sigma_1, \sigma_2 \ldots \sigma_8$ shift syndromes backward one bit |

We claim:

1. In a magnetic disk storage device comprising a sampled amplitude read channel for reading digital data stored on a magnetic disk by detecting digital data from a sequence of discrete time sample values generated by sampling pulses in an analog read signal from a magnetic read head positioned over the magnetic disk, a thermal asperity (TA) compensator comprising:

(a) a sampling clock;
   (b) a sampling device, responsive to the sampling clock, for sampling the analog read signal to generate the discrete time sample values;
   (c) a discrete time sequence detector for detecting an estimated digital sequence from the discrete time sample values;
   (d) a TA detector, responsive to the discrete time sample values, for detecting the occurrence of a thermal asperity and generating erasure pointers corresponding to a location in the estimated digital sequence where a thermal asperity occurred; and
   (e) an error detection and correction (EDAC) system, responsive to the erasure pointers, for correcting errors in the estimated digital sequence caused by the thermal asperity.

2. In a disk drive storage system comprising a read head position over a magnetic disk for generating an analog read signal by detecting magnetic transitions on the magnetic disk, a thermal asperity (TA) compensator comprising:

(a) a data detector for detecting an estimated digital sequence from the analog read signal;
   (b) a TA detector for detecting the occurrence of a thermal asperity in the analog read signal and generating erasure pointers corresponding to a location in the estimated digital sequence where a thermal asperity occurred; and
   (c) an error detection and correction (EDAC) system, responsive to the erasure pointers, for correcting errors in the estimated digital sequence caused by the thermal asperity.

3. The thermal asperity compensator as recited in claim 2, wherein the TA detector generates a control signal for adjusting a pole of a coupling capacitor.

4. The thermal asperity compensator as recited in claim 2, wherein the TA detector generates a control signal for holding operation of a timing recovery, gain control and DC offset loop during a duration of the thermal asperity.

5. The thermal asperity compensator as recited in claim 2, wherein the EDAC system operates on-the-fly when detecting and correcting hard errors caused by thermal asperities and soft errors caused by other channel noise.

6. The thermal asperity compensator as recited in claim 2, wherein the EDAC system comprises a erasure value generator, responsive to the erasure pointers, for generating erasure values computed as $\alpha$ raised to the power of the erasure pointer location in the estimated digital sequence.

7. The thermal asperity compensator as recited in claim 2, wherein the EDAC system comprises a finite field inversion circuit that operates on the estimated digital sequence in a standard and dual basis representation.

8. The thermal asperity compensator as recited in claim 2, wherein the EDAC system comprises a Reed-Solomon decoder comprising:

(a) a syndrome generator for generating syndromes from the estimated digital sequence;
   (b) a decoder for generating the coefficients of an error locator polynomial $\sigma(x)$; and
   (c) an error value generator, responsive to the error locator polynomial $\sigma(x)$, for generating error values used to correct errors in the estimated digital sequence.

9. The thermal asperity compensator as recited in claim 8, wherein the syndrome generator, decoder and error value generator are implemented in hardware.

10. The thermal asperity compensator as recited in claim 2, wherein the TA detector comprises:
   (a) a sampling device for sampling the analog read signal to generate a sequence of discrete time sample values;
   (b) a saturation detector for detecting the occurrence of a saturation condition in the discrete time sample values indicating the occurrence of a thermal asperity; and
   (c) an erasure pointer generator for generating the erasure pointers.

11. The thermal asperity compensator as recited in claim 10, wherein the TA detector further comprises a buffer for buffering the erasure pointers and synchronizing the erasure pointers to the corresponding error locations in the estimated digital sequence corrected by the EDAC system.

12. The thermal asperity compensator as recited in claim 10, wherein:
   (a) the TA detector further comprises a means for determining a duration of a detected thermal asperity;
   (b) the duration is proportional to a number of saturated discrete time sample values caused by the detected thermal asperity.

13. In a magnetic disk storage device comprising a sampled amplitude read channel for reading digital data stored on a magnetic disk by detecting digital data from a sequence of discrete time sample values generated by sampling pulses in an analog read signal from a magnetic read head positioned over the magnetic disk, a method for compensating for thermal asperity (TA) comprising the steps of:
   (a) sampling the analog read signal to generate the discrete time sample values;
   (b) detecting an estimated digital sequence from the discrete time sample values;
   (c) detecting the occurrence of a thermal asperity from the discrete time sample values;
   (d) generating erasure pointers corresponding to a location in the estimated digital sequence where the thermal asperity occurred; and
   (e) correcting errors in the estimated digital sequence caused by the thermal asperity using the erasure pointers.

14. In a disk drive storage system comprising a read head position over a magnetic disk for generating an analog read signal by detecting magnetic transitions on the magnetic disk, a method for compensating for thermal asperity (TA) comprising the steps of:
   (a) detecting an estimated digital sequence from the analog read signal;
   (b) detecting the occurrence of a thermal asperity in the analog read signal;
   (c) generating erasure pointers corresponding to a location in the estimated digital sequence where the thermal asperity occurred; and
   (d) correcting errors in the estimated digital sequence caused by the thermal asperity using the erasure pointers.

* * * * *